(12) United States Patent
Jones et al.

(10) Patent No.: US 10,157,710 B2
(45) Date of Patent: Dec. 18, 2018

(54) PROCESS OF FORMING A PHOTOACTIVE LAYER OF AN OPTOELECTRONIC DEVICE

(71) Applicant: COMMONWEALTH SCIENTIFIC AND INDUSTRIAL RESEARCH ORGANISATION, Acton (AU)

(72) Inventors: Timothy William Jones, Waratah (AU); Gregory Joseph Wilson, Cameron Park (AU); Kenrick Forrest Anderson, Mayfield (AU); Anthony Frank Hollenkamp, Camberwell (AU); Noel William Duffy, Ormonde (AU); Nienke Joan Firet, The Hague (NL)

(73) Assignee: COMMONWEALTH SCIENTIFIC AND INDUSTRIAL RESEARCH ORGANISATION, Acton (AU)

( * ) Notice: Subject to any disclaimer, the term of this patent is extended or adjusted under 35 U.S.C. 154(b) by 0 days.

(21) Appl. No.: 15/537,091

(22) PCT Filed: Dec. 21, 2015

(86) PCT No.: PCT/AU2015/050824
§ 371 (c)(1),
(2) Date: Jun. 16, 2017

(87) PCT Pub. No.: WO2016/094966
PCT Pub. Date: Jun. 23, 2016

(65) Prior Publication Data
US 2018/0005764 A1      Jan. 4, 2018

(30) Foreign Application Priority Data

Dec. 19, 2014   (AU) ................................ 2014905161

(51) Int. Cl.
*H01L 21/00* (2006.01)
*H01G 9/20* (2006.01)
(Continued)

(52) U.S. Cl.
CPC ........... *H01G 9/2059* (2013.01); *C23C 14/14* (2013.01); *C23C 14/34* (2013.01);
(Continued)

(58) Field of Classification Search
CPC .............................. H01G 9/2059; C23C 14/14
(Continued)

(56) References Cited

U.S. PATENT DOCUMENTS

2011/0146767 A1    6/2011  Lu
2017/0084399 A1*   3/2017  Vak ..................... H01L 51/0004
2017/0358398 A1*  12/2017  Beaumont ............ H01G 9/2009

FOREIGN PATENT DOCUMENTS

KR    2014-0007045 A    1/2014
WO    WO 2014/020499 A1    2/2014
WO    WO 2014/045021 A1    3/2014

OTHER PUBLICATIONS

Hao et al., "Lead-free solid-state organic-inorganic halide perovskite solar cells," Nature Photonics, pp. 489-494, May 2014.
(Continued)

*Primary Examiner* — David S Blum
(74) *Attorney, Agent, or Firm* — Foley & Lardner LLP

(57) ABSTRACT

A process of forming a thin film photoactive layer of an optoelectronic device comprising: providing a substrate having a surface comprising or coated with a metal M selected from at least one of Pb, Sn, Ge, Si, Ti, Bi, or In; and converting the metal surface or metal coating of the substrate to a perovskite layer.

17 Claims, 21 Drawing Sheets

Type A

Type B

(51) Int. Cl.
| | |
|---|---|
| H01L 31/0392 | (2006.01) |
| H01L 31/032 | (2006.01) |
| H01L 51/42 | (2006.01) |
| C25D 3/34 | (2006.01) |
| C25D 5/48 | (2006.01) |
| C25D 13/02 | (2006.01) |
| C23C 18/31 | (2006.01) |
| C23C 14/14 | (2006.01) |
| C23C 14/58 | (2006.01) |
| C23C 14/34 | (2006.01) |
| C23C 24/04 | (2006.01) |
| C25D 3/30 | (2006.01) |
| C25D 3/54 | (2006.01) |
| H01L 51/00 | (2006.01) |
| H01L 51/44 | (2006.01) |
| C23C 18/12 | (2006.01) |
| C23C 18/16 | (2006.01) |

(52) U.S. Cl.
CPC ...... *C23C 14/5846* (2013.01); *C23C 18/1689* (2013.01); *C23C 18/31* (2013.01); *C23C 24/04* (2013.01); *C25D 3/30* (2013.01); *C25D 3/34* (2013.01); *C25D 3/54* (2013.01); *C25D 5/48* (2013.01); *C25D 13/02* (2013.01); *H01L 31/0324* (2013.01); *H01L 31/0392* (2013.01); *H01L 51/0002* (2013.01); *H01L 51/0032* (2013.01); *H01L 51/4226* (2013.01); *C23C 18/1216* (2013.01); *C23C 18/1694* (2013.01); *H01L 51/447* (2013.01); *Y02E 10/549* (2013.01)

(58) Field of Classification Search
USPC .......................................................... 438/82
See application file for complete search history.

(56) References Cited

OTHER PUBLICATIONS

International Search Report dated May 31, 2016 in application No. PCT/AU2015/050824.

\* cited by examiner

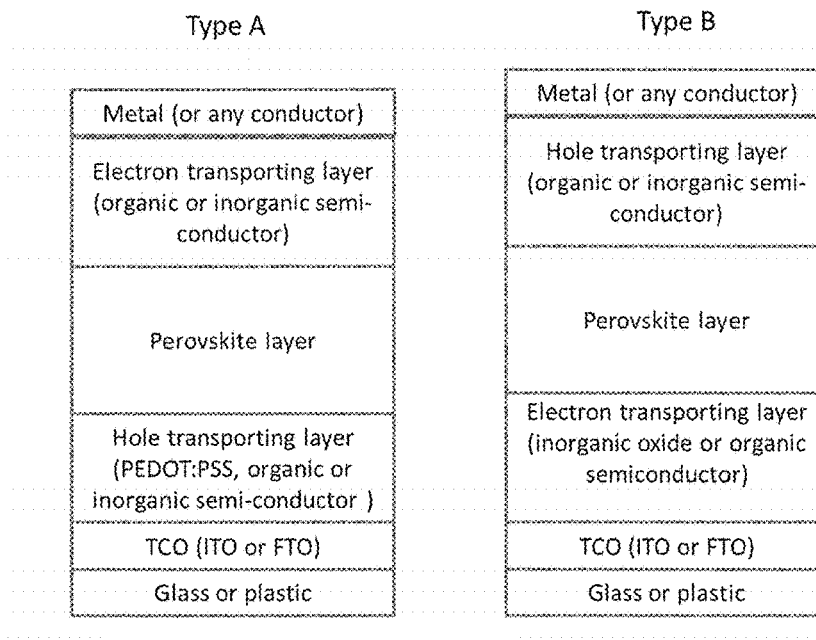
Figure 1
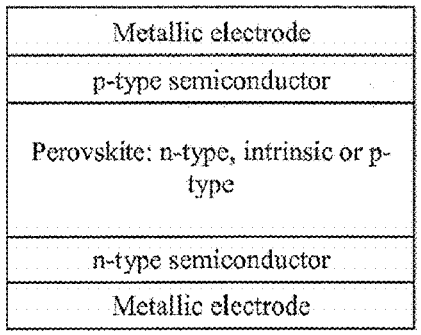
(a)
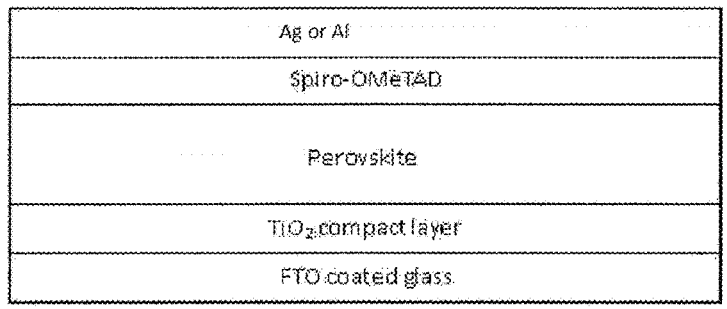
(b)
Figure 2

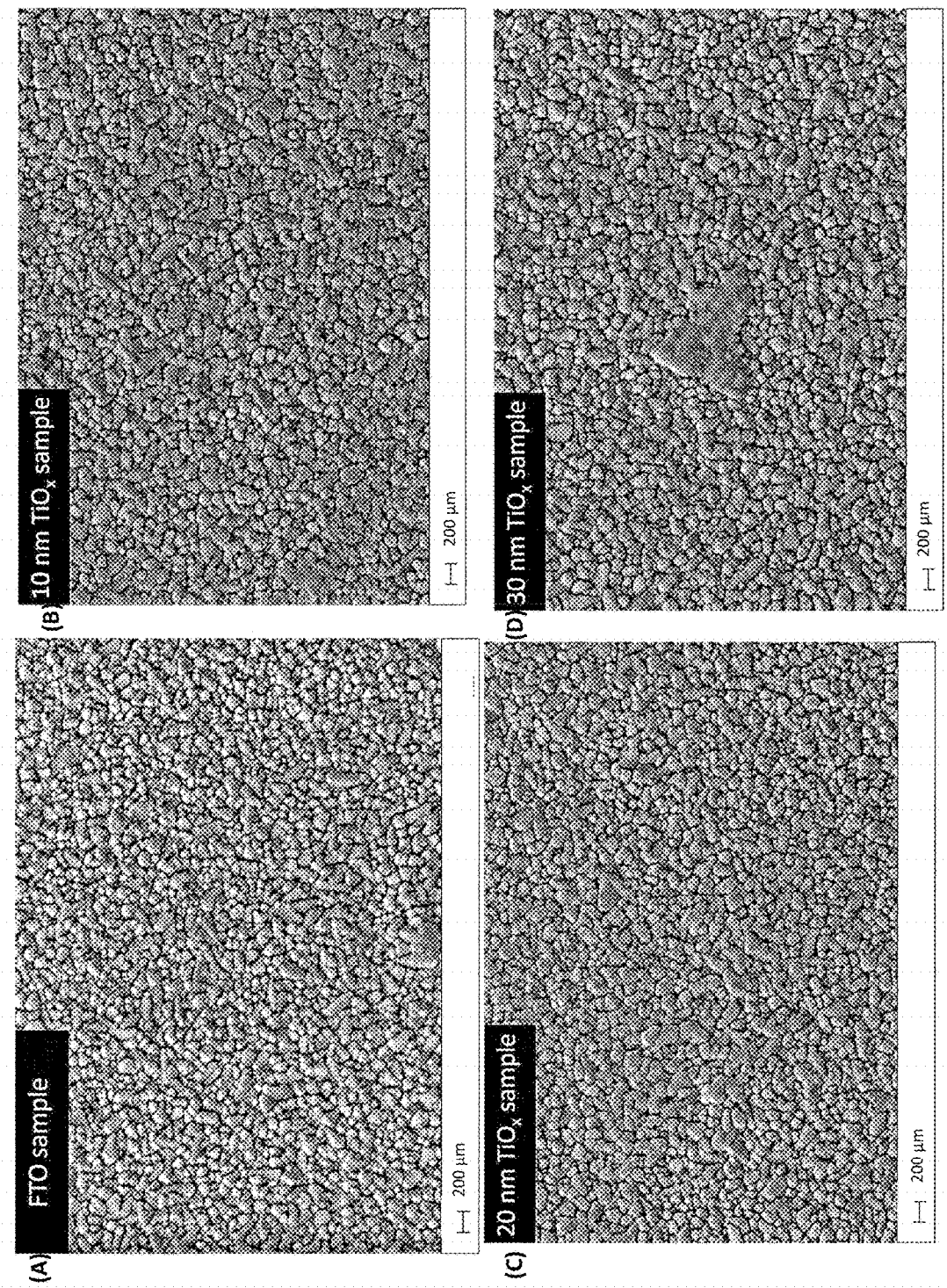
Figure 12 (a) to (d)

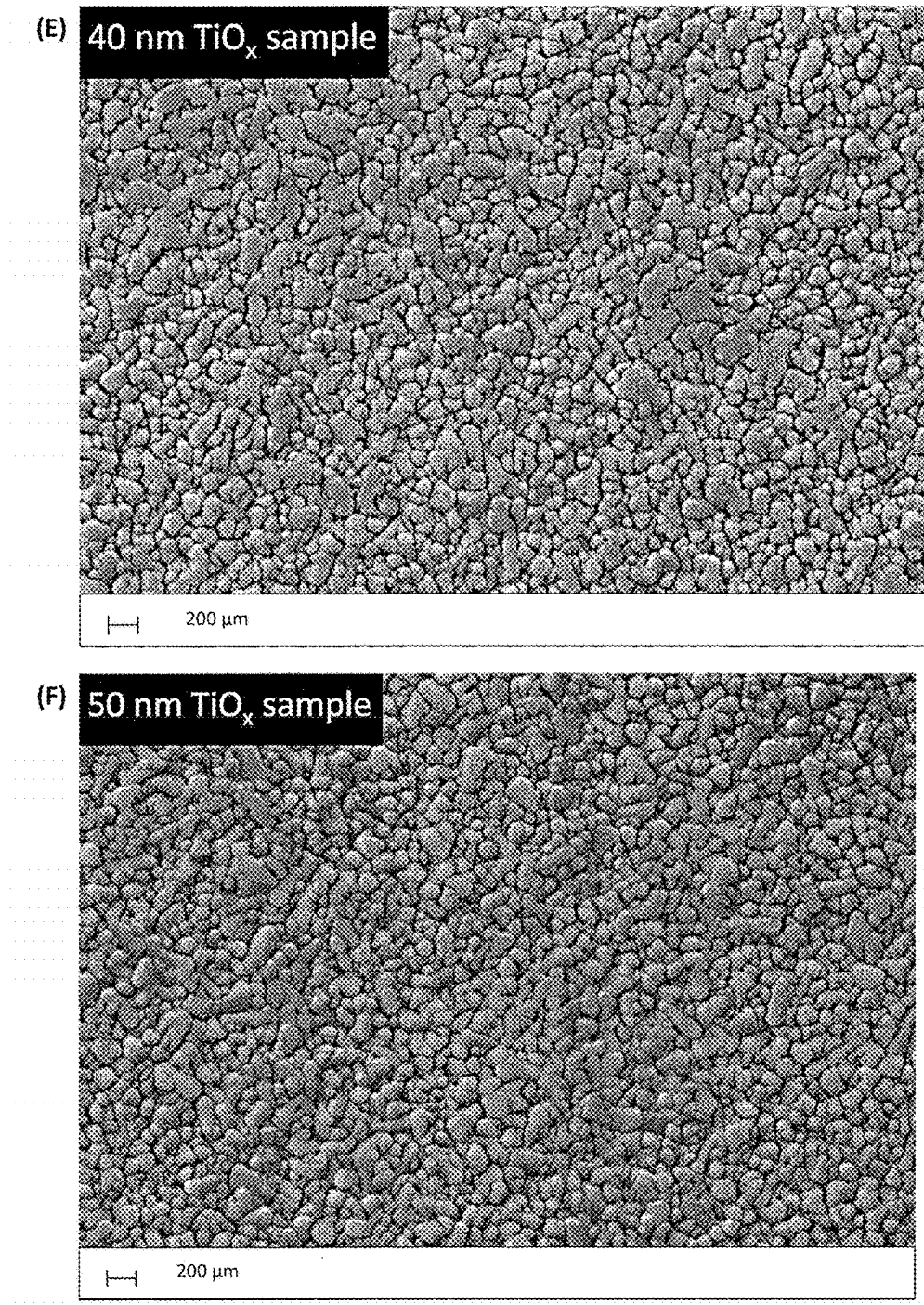
Figure 12 (e) and (f)

PROCESS OF FORMING A PHOTOACTIVE LAYER OF AN OPTOELECTRONIC DEVICE

TECHNICAL FIELD

The present invention generally relates to a process of forming a photoactive layer of an optoelectronic device. The invention is particularly applicable for perovskite type solar cells and it will be convenient to hereinafter disclose the invention in relation to that exemplary application.

BACKGROUND TO THE INVENTION

The following discussion of the background to the invention is intended to facilitate an understanding of the invention. However, it should be appreciated that the discussion is not an acknowledgement or admission that any of the material referred to was published, known or part of the common general knowledge as at the priority date of the application.

Photovoltaic (PV) cells that convert sunlight directly into electricity are becoming increasingly important in the world's renewable energy mix. Currently, around 85% of PV cells have a photoactive element based on crystalline Si, with the rest being polycrystalline thin film PV cells, mostly cadmium telluride/cadmium sulfide ones. Thin-film cells tend to be cheaper to make with a shorter energy payback time. A rapidly developing newcomer to the thin film PV field is based on organic-inorganic perovskite-structured semiconductors, the most common of which is the triiodide ($CH_3NH_3PbI_3$). Such Perovskites tend to have high charge-carrier mobilities and therefore make ideal photoactive components.

Large scale production of these types of PV cells is difficult because the process of applying the photoactive layer has been found to be difficult to scale.

Vacuum evaporation has been proposed for constructing perovskite thin films utilising co-evaporation of two precursors ($PbCl_2$ and $CH_3NH_3I$). Whilst the resulting films exhibit satisfactory perovskite film coverage and uniformity, this technique demands high vacuum, and therefore is very energy intensive in a scaled up process.

Alternatively, solution-based techniques can be used to fabricate thin films, in which a mixture of two precursors is used to form the completed absorber. Spin coating can be used at the lab scale to coat a perovskite precursor solution onto a substrate. Spin coating allows for the formation of large size crystals to be minimized or controlled formation thereby forming very homogenous films over an area up to 300 mm in diameter. However, it is not possible to use spin coating on a larger scale. In a scalable coating/printing process, for example dipping or wet coating, a wet film of Perovskite coating material is formed first and then dried. This has a significantly different solution dynamic and drying time compared to spin coating. In wet coating, the wet film is susceptible to dewetting, non-homogenous crystal formation and/or the formation of pinholes, all of which have undesirable effects on the function of the photoactive layer. These problems become increasingly more serious the greater the amount and area to which the crystalline material is applied.

In yet another method, a metal compound layer is formed on a substrate, for example by electrodeposition (for example a PbO layer in, Cui et al, *Electrodeposition of PbO and In Situ Conversion to $CH_3NH_3PbI_3$ for Mesoscopic Perovskite Solar Cells* Chem. Commun., 2014, DOI) which is subsequently converted to a Perovskite coating through reaction with suitable precursor materials. Whilst a thin layer can be formed by this method, the deposition kinetics of metal compounds on the substrate to produce a suitably thick layer is slow (typically more than 1 hour). Commercial scale-up of these types of processes is therefore limited.

It is therefore desirable to provide a new and/or improved process or method of forming a photoactive layer of an optoelectronic device.

SUMMARY OF THE INVENTION

The present invention relates to an alternate method of forming a photoactive layer of a thin film optoelectronic device.

A first aspect of the present invention provides a process of forming a thin film photoactive layer of an optoelectronic device comprising:

providing a substrate having a surface comprising or coated with a metal M selected from at least one of Pb, Sn, Ge, Si, Ti, Bi, or In; and converting the metal surface or metal coating of the substrate to a perovskite layer.

The perovskite semiconductor forming the photoactive layer is formed by conversion of a metallic layer of or on the substrate to a perovskite through treatment with a suitable reactive compound, for example acetic acid, halide, organohalide or inorganic halide or combination thereof, such that the metallic surface forms an intermediate compound that can subsequently be converted to the active perovskite material. It should be understood that by metal and metallic the invention relates to the atomic or alloy form of said metal and not an ionic form thereof. By using a metal layer (provided by the substrate as a coating or in the comprising material) and subsequent semiconductor formation, the spatial and scalar uniformity of an optoelectronic device is improved in an economic manner. The use of such a composite electrode material in an optoelectronic device addresses the scalar limitations imposed by existing fabrication processes for perovskite semiconductors. This method can also provide improved energy conversion capabilities.

The substrate may therefore comprise or include a layer of the desired metal M, or may be coated with a layer of the desired metal M. Where the substrate is coated with a layer of metal M, the process of the present invention can further comprise prior to the converting step:

applying at least one coating of a metal M selected from at least one of Pb, Sn, Ge, Si, Ti, Bi, or In to a substrate to form a coated substrate.

In these embodiments, the process of forming a thin film photoactive layer of an optoelectronic device can comprise the steps of:

applying at least one coating of a metal M selected from at least one of Pb, Sn, Ge, Si, Ti, Bi, or In to a substrate to form a coated substrate; and converting the metal coating of the coated substrate to a perovskite layer.

In these embodiments, the perovskite semiconductor forming the photoactive layer is formed by deposition of a thin metallic layer on the substrate that is subsequently converted to a perovskite through treatment with a suitable reactive compound, including acetic acid, halide, organohalide or inorganic halide or combination thereof, such that the metallic surface forms an intermediate compound that can subsequently be converted to the active perovskite material. In some embodiments, the direct deposition of a metal such as Pb can result less oxygen present within the final perovskite film, say for example compared to depositing a metal compound, such as PbO.

The metal M can be coated on the substrate using a number of different techniques:

In some embodiments, at least one coating of a metal M is applied to the substrate by a deposition method. In this particular embodiment, the metal M may be applied or otherwise coated onto a surface of the substrate using an electrodeposition method or technique. Examples of suitable deposition methods include at least one of electrodeposition, electroplating, electrophoretic deposition or electroless deposition.

Electroless deposition or electroless plating uses a redox reaction to deposit metal on a substrate without the passage of an electric current.

In electrophoretic deposition (EPD) the substrate (in this case a conducting substrate) is submerged in a container which holds a coating bath or solution. A directed current is applied through the coating bath using electrodes. The conductive substrate is one of the electrodes, and a set of "counter-electrodes" are used to complete the circuit.

In electrodeposition, the substrate forms the cathode of an electrolysis cell. The electrolysis cell comprises a current source, container including the cathode, an anode immersed in an electrolyte. The desired metal cations are deposited onto the substrate when an electrical current, electrical potential or any form of electrical modulation is applied through and between the anode and the cathode. The metal ions can be provided by a sacrificial anode or in the electrolyte.

Electrodeposition as a fabrication method for a photoactive layer has a number of advantages over existing fabrication methods such as printing, including:

Non-toxic organic solvent, which can be readily evaporated;
Applicable to large areas, likely to be deposited on up to 2 m×2 m substrates or larger;
Low capital equipment costs for electrodeposition compared to other techniques, for example roll-to-roll printing; and
Eliminates need for multiple printed layers.

In particular embodiments, an electrodeposition technique is used to form the at least one coating of metal M on the substrate. In such embodiments, the technique of chronoamperometry is preferably used to deposit the at least one coating of metal M on the substrate. Chronoamperometry is literally, time-current or measure current vs time at a fixed potential. However, it should be appreciated that chronoamperometry is not the only method to produce a dense thin film of metal M on the substrate. Other methods (or combinations of which) can also be used.

In other embodiments, the at least one coating of a metal M is applied to the substrate by a physical coating method. Examples of suitable physical coating methods includes at least one of sputter coating, cold spray; application of solid film or layer to the substrate or the like.

Sputter deposition is a physical vapour deposition (PVD) method involving ejecting material (in this case the desired metal M) from a source onto a substrate housed in a vacuum chamber to form a thin film of the sputter material on a target surface of the substrate.

Cold spray coating involves the acceleration of solid powders in a supersonic gas jet and subsequent impact with the substrate, to plastically deform and adhere those particles onto the surface of the target substrate.

In some embodiments, a thin metal film of the requisite metal M can be adhered to, melted or otherwise applied onto a suitable surface of a substrate.

In other embodiments, the substrate comprises a metal film of the requisite metal M. In these embodiments, the coating of the requisite metal M is provided through the provision of a substrate having the requisite surface composition. A metal surface of that substrate can then be converted to a perovskite layer.

In yet other embodiments, the at least one coating of a metal M is applied to the substrate by an evaporative coating method. Evaporation or evaporative deposition is a method of thin-film deposition in which the source material, in the case of the present invention metal M, is evaporated in a vacuum or reduced pressure and condensed on the surface of the target substrate. Metal deposition rates on the substrate are typically between 0.2 and 1.5 Angstrom/second, preferably between 0.5 and 1.0 Angstrom/second. The expected deposition time is typically between 5 and 30 mins, preferably between 10 and 20 mins.

Metal deposition rates on the substrate for some coating processes, such as evaporative deposition can be between 0.2 and 1.5 Angstrom/second, preferably between 0.5 and 1.0 Angstrom/second. The expected deposition time is typically between 5 and 30 mins, preferably between 10 and 20 mins. It should be appreciated that metal deposition rates on the substrate for other coating processes may differ from the above ranges, and may be less than or greater than 1.5 Angstrom/second. Where the metal deposition rates are higher than the above ranges, the technique would have a resultantly shorter deposition time. For example, electrodeposition may have deposition times of less than 1 minute in some instances. The above coating processes therefore have a fast deposition method compared to deposition of other species or compounds. A suitable film can therefore be formed on a substrate surface in a shorter time compared to compounds of that metal, for example co-evaporation of $PbCl_2/PbI_2$ and $CH_3NH_3I$ is a slow process, particularly compared to deposition of Pb using the above described methods.

It should be appreciated that the substrate can have any suitable architecture. In some embodiments, substrate and metal coated layer has a planar architecture and therefore produced flat perovskite layers. In other embodiments, the substrate and/or the deposited metal layer have a 3-dimensional layer structure or structures. It should be understood that other substrate and/or deposited metal layer architecture may also be possible.

The resulting coating of a metal M (seed coating) is preferably amorphous or substantially amorphous as determined by XRD. Furthermore, the surface roughness of the coating of a metal M is preferably lower than the surface roughness of the substrate. This difference (in terms of RMS (root mean squared) roughness) is preferably at least 2 nm and more preferably at least 3 nm.

This metal coating of the coated substrate can be subsequent converted to a perovskite layer using a number of different method steps:

For example, in a first embodiment, the converting step can comprise: contacting the at least one coating of the metal coated substrate with a vapour X selected from a halide vapour comprising at least one of F, Cl, Br or I, or acetic acid vapour to form a metal compound $MX_2$ coating on the coated substrate; and thereafter applying at least one perovskite precursor to the coated substrate to form the perovskite layer.

In these embodiments, the perovskite semiconductor comprising the photoactive layer is formed by oxidation of a thin metallic layer in the presence of a vapour and subsequent treatment with an organohalide compound.

The halide vapour can be produced by a variety of sources. In some embodiments, the halide vapour results from vapour from at least one of: one or more halide containing solutions; or one or more halide solids. For example, suitable halide containing solutions include KCl, KI, HCl, HBr; halide salts such as KCl, KI, HCl, HBr or other salt of a halogen; eutectic melts; and room-temperature ionic liquid (RTIL) eutectic melts. Examples of suitable halide solids include $I_2$, $CH_3NH_3X$.

Acetic acid vapour can also be produced by a variety of means. In some embodiments, acetic acid is heated to an appropriate temperature. The use of acetic acid vapour results in the at least one coating of the metal coated substrate to forming a metal acetate intermediate layer, which can then be converted to the active perovskite film, for example via a solution/vapour diffusion process.

As can be appreciated, the reaction between a solid metal layer and a vapour X can be optimised when undertaken in selected conditions. In some embodiments, the at least one coating of the metal coated substrate is contacted with a vapour X at between 50 and 200° C., preferably between 75 and 150° C. The reaction can be conducted at various pressures. In some embodiments, the at least one coating of the metal coated substrate is contacted with a vapour X at ambient pressure. In other embodiments, the at least one coating of the metal coated substrate is contacted with a vapour X in a reduced pressure, preferably in a vacuum. In exemplary embodiments, the at least one coating of the metal coated substrate is contacted with a vapour X in a bomb type reactor. However, it should be appreciated that other suitable reactors and vessels could also be used for this process step.

In some embodiments, the metal compound $MX_2$ coating on the coated substrate comprises crystallite having a size of less than 100 nm, preferably between 1 nm and 100 nm, more preferably between 10 nm and 90 nm.

The perovskite precursor applied to the coated substrate can take any suitable form. In some embodiments, the perovskite precursor comprises a solution. The solution preferably comprises one or more perovskite precursor compounds dissolved in a solvent. In other embodiments, the perovskite precursor comprises at least one perovskite precursor vapour. The perovskite layer is therefore formed in a vapour assisted process. For example, the perovskite layer could be formed by vapour deposition. In such embodiments, the vapour deposition process can comprises: exposing the coated substrate to a perovskite precursor vapour comprising the perovskite precursor or one or more reactants for producing said perovskite precursor; and allowing deposition of the perovskite precursor vapour onto the metal halide $MX_2$ coating on the coated substrate, to produce a perovskite layer thereon. Vapour deposition is preferably allowed to continue until the solid layer of perovskite has a thickness of from 25 nm to 100 μm, preferably from 100 nm to 700 nm. The perovskite precursor vapour can be produced by any number of means. In some embodiments, the perovskite precursor vapour is produced by evaporating said perovskite or evaporating one or more reactants for producing said perovskite. The perovskite precursor vapour can comprise two reactants or more for producing said perovskite. In some embodiments, the perovskite precursor vapour comprises two reactants for producing said perovskite by evaporating a first reactant from a first source and evaporating a second reactant from a second source.

In a first embodiment, the converting step comprises: applying at least one perovskite precursor to the metal coating of the coated substrate to form the perovskite layer.

In these embodiments, the perovskite semiconductor forming the photoactive layer is therefore subsequent solution treatment of the metal layer with an organohalide compound.

In some embodiments, the present invention therefore comprises a process of forming a thin film photoactive layer of an optoelectronic device comprising:

applying at least one coating of a metal M selected from at least one of Pb, Sn, Ge, Si, Ti, Bi, or In to a substrate to form a coated substrate; and converting the metal coating of the coated substrate to a perovskite layer, said conversion including the application at least one perovskite precursor, wherein the perovskite precursor comprises at least one compound having the formula AX, or at least one reaction constituent for forming at least one compound having the formula AX, in which A comprises an ammonium group or other nitrogen containing organic cation and X is selected from at least one of F, Cl, Br or I.

Any suitable perovskite precursor containing solution can be used. In most embodiments, the perovskite precursor solution comprises at least one perovskite precursor dissolved in a coating solvent. Suitable coating solvents for the AX "perovskite precursor salts" are preferably solvents in which $PbI_2$ is insoluble, such as isopropanol or other alcohols or alcohol based solvents, alcohol blends or the like.

The perovskite precursor comprises a molecule which crystallises with perovskite structure. The perovskite precursor preferably comprises at least one compound having the formula AX, or at least one reaction constituent for forming at least one compound having the formula AX, in which A comprises an ammonium group or other nitrogen containing organic cation and X is selected from at least one of F, Cl, Br or I. The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $AMX_3$, wherein A and M are cations of different sizes and X is an anion. In many embodiments, M comprises a metal cation, and more preferably a divalent metal cation such as $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. In some embodiments, the second cation may be selected from $Sn^{2+}$, $Pb^{2+}$ and $Cu^{2+}$.

In the unit cell, the A cations are at (0,0,0), the M cations are at (½, ½, ½) and the X anions are at (½, ½, 0). The A cation is usually larger than the M cation. The skilled person will appreciate that when A, M and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the K2 iF4-type structure comprises a layer of perovskite material.

The perovskite semiconductor employed in the present invention is typically one which is capable of (i) absorbing light, and thereby generating free charge carriers; and/or (ii) emitting light, by accepting charge, both electrons and holes, which subsequently recombine and emit light. Thus, the perovskite employed is typically a light-absorbing and/or a light-emitting perovskite. The perovskite semiconductor employed in the present invention may therefore be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped.

In some embodiments, A in the perovskite precursor AX comprises an organic cation having the formula $(R_1R_2R_3R_4N)$, wherein:

$R_1$ is hydrogen, unsubstituted or substituted C1-C20 alkyl, or unsubstituted or substituted aryl;

$R_2$ is hydrogen, unsubstituted or substituted C1-C20 alkyl, or unsubstituted or substituted aryl;

$R_3$ is hydrogen, unsubstituted or substituted C1-C20 alkyl, or unsubstituted or substituted aryl; and $R_4$ is hydrogen, unsubstituted or substituted C1-C20 alkyl, or unsubstituted or substituted aryl.

In some embodiments, A in perovskite precursor AX comprises an organic cation having the formula $(R_5R_6N=CH-NR_7R_8)$, and wherein:

$R_5$ is hydrogen, unsubstituted or substituted C1-C20 alkyl, or unsubstituted or substituted aryl;

$R_6$ is hydrogen, unsubstituted or substituted C1-C20 alkyl, or unsubstituted or substituted aryl;

$R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl.

In some embodiments, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl. In some embodiments, F can be a substituent of the alkyl chain attached to N or the sub-alkyl chain from the N, Alternatively, the organic cation may have the formula $(R_5NH_3)^+$ wherein: $R_5$ is hydrogen, or unsubstituted or substituted C1-C20 alkyl. For instance, $R_5$ may be methyl or ethyl. Typically, $R_5$ is methyl.

In some embodiments, the organic cation has the formula $R_5R_6N=CH-NR_7R_8$ wherein: $R_5$ is hydrogen, unsubstituted or substituted C1-C20 alkyl, or unsubstituted or substituted aryl; $R_5$ is hydrogen, unsubstituted or substituted C1-C20 alkyl, or unsubstituted or substituted aryl; $R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl. Typically, $R_5$ in the cation is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl. The organic cation may, for example, have the formula $(H_2N=CH-NH_2)^+$.

As used herein, an alkyl group can be a substituted or unsubstituted, linear or branched chain saturated radical, it is often a substituted or an unsubstituted linear chain saturated radical, more often an unsubstituted linear chain saturated radical. A C1-C20 alkyl group is an unsubstituted or substituted, straight or branched chain saturated hydrocarbon radical. Typically it is C1-C10 alkyl, for example methyl, ethyl, propyl, butyl, pentyl, hexyl, heptyl, octyl, nonyl or decyl, or C1-C6 alkyl, for example methyl, ethyl, propyl, butyl, pentyl or hexyl, or C1-C4 alkyl, for example methyl, ethyl, i-propyl, n-propyl, t-butyl, s-butyl or n-butyl.

When an alkyl group is substituted it typically bears one or more substituents selected from substituted or unsubstituted C1-C20 alkyl, substituted or unsubstituted aryl (as defined herein), cyano, amino, C1-C10 alkylamino, di(C1-C10)alkylamino, arylamino, diarylamino, arylalkylamino, amido, acylamido, hydroxy, oxo, halo, carboxy, ester, acyl, acyloxy, C1-C20 alkoxy, aryloxy, haloalkyl, sulfonic acid, sulfhydryl (i.e. thiol, —SH), d-C10 alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a C1-C20 alkyl group in which at least one hydrogen atom has been replaced with an aryl group. Examples of such groups include, but are not limited to, benzyl (phenylmethyl, $PhCH_2$—), benzhydryl ($Ph_2CH$—), trityl (triphenylmethyl, $Ph_3C$—), phenethyl (phenylethyl, $Ph-CH_2CH_2$—), styryl (Ph-CH=CH—), cinnamyl (Ph-CH=CH—$CH_2$—). Typically a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from C1-C6 alkyl which is unsubstituted (to form an aralkyl group), aryl which is unsubstituted, cyano, amino, C1-C10 alkylamino, di(C1-C10)alkylamino, arylamino, diarylamino, arylalkylamino, amido, acylamido, hydroxy, halo, carboxy, ester, acyl, acyloxy, C1-C20 alkoxy, aryloxy, haloalkyl, sulfhydryl (i.e. thiol, —SH), C1-10 alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single C1-C6 alkylene group, or with a bidentate group represented by the formula —X—(C1-C6)alkylene, or —X—(C1-C6)alkylene-X—, wherein X is selected from O, S and R, and wherein R is H, aryl or C1-C6 alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically it carries 0, 1, 2 or 3 substituents.

The perovskite semiconductor employed in the optoelectronic device of the invention typically comprises at least one anion X selected from halide anions and chalcogenide anions. The term "halide" refers to an anion of a group 7 element, i.e., of a halogen. Typically, halide refers to a fluoride anion, a chloride anion, a bromide anion, an iodide anion or an astatide anion. The term "chalcogenide anion", as used herein refers to an anion of a group 6 element, i.e. of a chalcogen. Typically, chalcogenide refers to an oxide anion, a sulphide anion, a selenide anion or a telluride anion. In preferred embodiments, the anion X is selected from at least one of F, Cl, Br or I.

In some embodiments, the perovskite precursor comprises an organo-metal halide perovskite. In these embodiments, the first cation A is an organic cation, more preferably an ammonium group or other nitrogen containing organic cation. This organic cation (A) in this type of perovskite can comprise a large number of organic cation including protonated alkylamines, cycloalkylamines (such as pyrrolidine or cyclohexyl amine) arylamines and aromatic heterocycles (such as pyridine). In some embodiments, A comprises cations having the general formula $RCH_2NH_3^+$, $RC(NH_2)_2^+$, $R_aR_bCH_1NH_3^+$, $R_aR_bR_cCNH_3^+$, $R_aR_bNH_2^+$, or $R_aR_bR_cNH^+$, where R, $R_a$, $R_b$, $R_c$ comprises H or a substituted or unsubstituted alkyl group or groups, preferably a $C_1$ to $C_6$ substituted or unsubstituted alkyl or aryl group or groups.

Whilst a number of organo-metal halide perovskite are possible, preferred A of a perovskite precursor comprises at least one of $CH_3NH_3^+$, or $HC(NH_2)_2^+$. Thus, in some embodiments the perovskite precursor AX is selected from the group consisting of $CH_3NH_3X$ and $HC(NH_2)_2X$, and wherein X is selected from at least one of F, Cl, Br or I. For example, perovskite precursor may comprise a mixture of $CH_3NH_3Cl$ and $CH_3NH_3I$. Accordingly, in preferred embodiments AX comprises $CH_3NH_3X$.

The resulting perovskite layer preferably comprises an organo-metal halide perovskite. For example, in some embodiments the perovskite layer comprises at least one of $CH_3NH_3MX_3$ or $HC(NH_2)_2MX_3$, in which, M is selected from Pb, Sn, Tl, Bi, or In; and X is selected from at least one of F, Cl, Br or I. In other embodiments, the perovskite comprises an organo-lead halide perovskite, preferably comprising at least one of $CH_3NH_3PbX_3$ or $HC(NH_2)_2PbX_3$, in which X is selected from at least one of F, Cl, Br or I.

In some embodiments, in the optoelectronic device of the invention, the perovskite is a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ or $CH_3NH_3SnF_2Cl$.

Of course, X does not necessarily need to be a single halide. The resulting perovskite layer can include a mixed halide perovskite wherein X in $CH_3NH_3MX_3$ or $HC(NH_2)_2MX_3$ comprises two or more of F, Cl, Br or I. Accordingly, $CH_3NH_3MX_3$ could comprise $CH_3NH_3MCl_xI_{3-x}$, $CH_3NH_3MI_{3-x}Cl_x$ or similar. It should be appreciated that $CH_3NH_3MCl_xI_{3-x}$, $CH_3NH_3MI_{3-x}Cl_x$ or similar can comprise non-stoichiometric materials in which M is selected from at least one of Pb, Sn, Ge, Si, Ti, Bi, or In, preferably M is Pb. In an exemplary embodiment, the perovskite layer is one of the family $CH_3NH_3PbCl_xI_{3-x}$. In preferred embodiments, x is close to zero (i.e. very small chloride content). In other embodiments, x=0 providing a tri-iodide perovskite material layer.

The perovskite semiconductor used in the present invention can in embodiments be a photosensitizing material, i.e. a material which is capable of performing both photogeneration and charge (electron or hole) transportation.

The photoactive layer formed in the process of the present invention typically forms part of a thin film optoelectronic device. The metal coating on the coated substrate is preferably coated on the substrate to produce a metal layer thickness from 10 to 200 nm. In some embodiments, the thickness can be from 25 to 150 nm, more preferably from 30 to 100 nm, and yet more preferably less than 100 nm. In yet other embodiments, the thickness may be less than 25 nm, for example in multi-junction devices.

In some embodiments, the thickness of the layer of the perovskite layer is from 10 nm to 100 µm. More typically, the thickness of the perovskite layer is from 10 nm to 10 µm. Preferably, the thickness of the perovskite layer is from 50 nm to 1000 nm, for instance from 100 nm to 700 nm. In some embodiments, the thickness of the perovskite layer is often greater than 100 nm. The thickness may for example be from 100 nm to 100 µm, or for instance from 100 nm to 700 nm.

The perovskite precursor solution comprises the above perovskite precursor dissolved in the coating solvent. In some embodiments, the perovskite precursor solution comprises from 5 to 75 wt % perovskite precursor. In some embodiments, the perovskite precursor solution comprises from 10 to 70 wt % perovskite precursor, more preferably from 20 to 60 wt % perovskite precursor, yet more preferably from 25 to 50 wt % perovskite precursor. In one embodiment, the perovskite precursor solution comprises about 40 wt % perovskite precursor.

The perovskite precursor can be applied by any number of suitable processes. Suitable processes, particularly for solution forms of the perovskite precursor, include casting, doctor blading, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, spin coating or dip coating. In a preferred embodiment, the perovskite precursor is applied by dipping the coated substrate into the perovskite precursor solution.

The applied coating can be applied to any suitable substrate. It should be appreciated that the substrate selected for the photoactive layer will be selected to suit the particular optoelectronic device and application thereof. The substrate is also selected to suit the particular metal coating application process. For example for some processes (e.g. electrodeposition) the substrate is preferably comprises a conductive substrate. Suitable substrates include polymers, metals, ceramics and glasses. In some embodiments, the substrate comprises at least one of: metal, preferably selected from at least one of Pb, Sn, Ge, Si, Ti, Bi, In, Ni, Fe, stainless steel; FTO/ITO glass; glass with a conductive layer; polymer or plastic; or carbons/nanocarbons based substrates. In some embodiments, the substrate comprises $TiO_2$ or includes at least a coating of $TiO_2$ on which a metal M can be formed or applied.

In some embodiments, the substrate comprises a polymer or plastic for example PET. For example, for flexible photoactive devices, such as flexible solar cell applications, the substrate preferably comprises a polymer film. In some embodiments, the substrate comprises a metal mesh, preferably Ni mesh. In other embodiments, the substrate comprises a glass or polymer substrate with a conductive layer such as a metal coating. The metal coating can be applied by various techniques including deposition methods such as electrodeposition or electroplating, physical application methods such as cold spray or sputter; evaporative coating or the like. In other embodiments, the substrate comprises a metal film of the requisite metal M.

As will be appreciated, the substrate can include one or more layers or coatings onto which the applied layer is applied. These coatings are preferably selected from at least one of:

at least one coating of a transparent conductive oxide (TCO);
at least one electrode screening layer;
at least one hole blocking layer;
at least one electron blocking layer;
at least one hole transporting layer; or
at least one electron transporting layer.

For example, the substrate can includes the following coatings:

at least one coating of a transparent conductive oxide (TCO) and at least one hole transporting layer applied to the TCO; or
at least one coating of a TCO and at least one electron transporting layer applied to the TCO.

In another example, the substrate can includes the following coatings:

at least one coating of a transparent conductive oxide (TCO) and at least one hole transporting layer applied to the TCO; or
at least one coating of a TCO and at least one electrode screening layer applied to the TCO.

The electrode screening material can be coated at a thickness of between 10-25 nm.

In some embodiments, the substrate can include a lead titanate ($PbTiO_3$) blocking layer. The lead titanate ($PbTiO_3$) blocking layer can be electrodeposited onto the substrate in some embodiments. It should be appreciated that lead titanate has a good crystal morphology for receiving a metal M for conversion into a perovskite. In some embodiments, the substrate includes an evaporated TiOx layer. For example, a blocking layer of TiOx is typically spin, screen or spray cast prior to formation of the perovskite layer. In some embodiments, a uniform deposit of the blocking layer is applied for example using DC magnetron sputtering.

In some embodiments, the at least one hole transporting layer comprises an organic or inorganic semiconductor. In some embodiments, the at least one electron transporting layer comprises an organic or inorganic conductor.

The coatings applied to the substrate typically depend on the configuration of the photoactive device in which the applied photoactive layer forms part of. In a conventional structure of a photoactive device layer the substrate includes at least one coating of a transparent conductive oxide (TCO) and at least one hole transporting layer applied to the TCO. In an inverted structure of a photoactive device layer the substrate includes at least one coating of a TCO and at least one electron transporting layer applied to the TCO. Of course various other layers are possible depending on the desired structure of the photoactive device, as would be evident to one skilled in the art.

The present invention also relates to use of a substrate having a surface comprising or coated with a metal M selected from at least one of Pb, Sn, Ge, Si, Ti, Bi, or In to form a thin film photoactive layer comprising:

converting the metal surface or metal coating of the substrate to a perovskite layer.

It should be appreciated that this aspect of the invention can include any one of the above discussed features.

The photoactive layer formed by the process of the present invention is one of a number of layers of a photovoltaic device such as a solar cell. Solar cells, particularly thin film and flexible solar cells are formed as a multilayer coating on a substrate. Each layer can be formed by one of a number of coating techniques. Suitable techniques include casting, doctor blading, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, or dip coating.

It should be appreciated that the present invention can be used to form single junction or multijunction cells. Multijunction (MJ) solar cells comprise solar cells with multiple p-n junctions, preferably made of different semiconductor materials. Each material's p-n junction will produce electric current in response to different wavelengths of light. Multijunction cells can be produced by layering a series of perovskite layers/structures formed using the process of the present invention. The use of multiple semiconducting materials allows the absorbance of a broader range of wavelengths, improving the cell's sunlight to electrical energy conversion efficiency. Examples of multijunction cells include the use with Si as a tandem structure, but also including multijunction perovskites where a distinct advantage of electrodeposited or vapour deposited embodiments is the ability to form multi-layered stacks of thin-films over large areas. In this respect, quantification of the spectral band edge of perovskite materials of varying composition. For example, in some embodiments, successive layers of a halide series from I, Cl, Br etc. would enable spectral tuning of the device and lead to a broader spectral response and higher efficiency. In some embodiments, the present invention is used to deposit a perovskite material with a suitable and complementary band gap would enable a broader spectral response of existing semiconductor photovoltaics, for example deposition of $CH_3NH_3PbI_3$ as a top-cell on silicon to form a tandem junction.

An optoelectronic device or photoactive device including a photoactive layer formed by the process of the present invention can be formed as an inverted structure or a conventional structure. A conventional structure is formed with a substrate having the following layers successively layered on a surface thereof: a transparent conductive oxide (TCO) layer, followed by a hole transporting layer; followed by the photoactive layer; followed by an electron transporting layer, and followed by a conductor layer (typically a metal). An inverted structure is formed with a substrate having the following layers successively layered on a surface thereof: a transparent conductive oxide (TCO) layer, followed by an electron transporting layer; followed by the photoactive layer; followed by a hole transporting layer, and followed by a conductor layer (typically a metal). A hole transporting (p-type) layer can be any hole-conducting material with appropriate valence band edge.

The perovskite precursor preferably form the intrinsic (i) layer of a optoelectronic device. The various other layers can comprise a number of suitable components currently known in the art. For example:

Suitable transparent conductive oxides (TCO) include tin doped indium oxide (ITO), fluoride-doped tin oxide (FTO), doped zinc oxide such as aluminium doped zinc oxide(AZO), or indium doped cadmium-oxide;

Suitable hole transporting layers include a transparent conducting polymer such as at least one of Poly(3,4-ethylenedioxythiophene) (PEDOT), poly(3,4-ethylenedioxythiophene and polystyrene sulfonate mixture (PEDOT:PSS), poly(4,4-dioctylcyclopentadithiophene); P3HT, doped P3HT (Poly(3-hexylthiophene-2,5-diyl)), poly[N-9″-heptadecanyl-2,7-carbazole-alt-5,5-(4′,7′-di-2-thienyl-2′,1′,3′-benzothiadiazole)] (PCDTBT), poly[2,6-(4,4-bis-(2-ethylhexyl)-4H-cyclopenta[2,1-b;3,4-b′]dithiophene)-alt-4,7(2,1,3-benzothiadiazole)] (PCPDTBT), poly(N-alkyldiketopyrrolopyrroledithienylthieno[3,2-b]thiophene) (DPP-DTT), [6,6]-Phenyl-C61-butyric acid methylester (PC60BM), indene-C60 bisadduct (ICBA), spiro-OMeTAD, MoO$_3$ or the like;

Suitable electron transporting layers include zinc oxide, titanium dioxide, tungsten trioxide or the like; and Suitable conductor layers comprise Au, Ag, C (for example graphite/carbon black, carbon nanotubes (CNTs), vapour-grown carbon fibres graphene or the like), Al, Mg, Cu or suitable alloys thereof or the like.

In some embodiments, the process of the present invention further includes the step of drying the applied coating. The drying step can comprise any number of drying process including air dry, convective drying, ambient drying, heat treatment, annealing or the like. In some embodiments, drying the applied coating includes heat treatment of the coated substrate at a temperature of at least 60° C., preferably at least 70° C., more preferably at least 100° C., and yet more preferably at least 120° C.

In embodiments, the conversion to the perovskite film morphology can be activated and controlled through variation of temperature.

The present invention also relates to one or more optoelectronic device including a photoactive layer formed using a process according to the present invention. The present invention also relates to one or more photoactive devices which include a photoactive layer formed using a process according to the present invention. The optoelectronic device can comprise a large range of photoactive devices such as photoelectric, photovoltaic and the like devices, including but not limited photovoltaic cells, photoactive sensors, including photodetectors, or the like.

An optoelectronic device according the present invention could therefore comprise a photoactive device, such as a photovoltaic cell, a photoactive sensor or a light emitting device. In some embodiments, the optoelectronic device can be selected from a photodiode; a phototransistor; a photomultiplier; a photo resistor; a photo detector; a light-sensitive detector; solid-state triode; a battery electrode; a light emitting device; a light emitting diode; a transistor; a solar cell; a laser; and a diode injection laser.

The optoelectronic device can have any suitable construction which incorporates a photoactive layer formed using a process according to the present invention. A second aspect of the present invention provides an optoelectronic device including a photoactive region which comprises:

a n-type region comprising at least one n-type layer;
a p-type region comprising at least one p-type layer; and
a photoactive layer formed by a process according to the first aspect of the present invention disposed between the n-type region and the p-type region.

The photoactive layer comprises a thin film or planar layer. The perovskite layer comprising the photoactive layer is preferably in contact with the n-type region and the p-type region. More preferably, the comprising perovskite semiconductor layer forms a planar heterojunction with the n-type region or the p-type region of the optoelectronic device.

It should be understood that as used herein, the term "n-type region", refers to a region of one or more electron-transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

It should also be understood that as used herein, the term "p-type region", refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The p-type region preferably comprises a p-type layer and a p-type exciton blocking layer. In some embodiments, the p-type exciton blocking layer is disposed between the p-type layer and the photoactive layer.

A third aspect of the present invention provides an optoelectronic device comprising:

a negative electrode comprising a current collector and a negative electrode material;
a positive counter electrode comprising a current collector and a positive electrode material; and
a charge transporting material between the positive electrode and negative electrode;
wherein one or both of the positive electrode material and negative electrode material comprises a composite electrode material comprising:
a conductive substrate;
an electrode-screening layer; and
a photoactive layer formed by a process according to the first aspect of the present invention.

It should be appreciated that the optoelectronic device can further include an external casing.

The electrode-screening layer preferably comprises at least one hole blocking layer; or at least one electron blocking layer. Furthermore, the photoactive layer preferably comprises one or more ordered perovskite semiconductor(s) as the photoactive material responsible for light absorption and charge transport that result in photon to electrical power conversion.

The perovskite layer preferably forms a planar heterojunction with the adjoining n-type region or the p-type region. Either the n-type region or the p-type region may be disposed on the perovskite layer. In some embodiments, the perovskite layer is in contact with both the n-type region and the p-type region. Thus, the perovskite layer may form planar heterojunctions with both the n-type and p-type regions on either side of the layer. Accordingly, in some embodiments of the optoelectronic device of the invention, the perovskite layer forms a first planar heterojunction with the n-type region and a second planar heterojunction with the p-type region.

The term "semiconductor" as used herein refers to a material with electrical conductivity intermediate in magnitude between that of a conductor and a dielectric. A semiconductor may be an n-type semiconductor, a p-type semiconductor or an intrinsic semiconductor.

Finally, it is noted that preferred embodiments of the optoelectronic device of the present invention will be produced without a porous TiO$_2$ film. This has two advantages:

1. The TiO$_2$ porous film is required to be sintered at 500° C. to function. Without a TiO$_2$ film, there is the opportunity to remove an energy-intensive fabrication process; and 2. Electrons are injected into TiO$_2$ in the mesoporous architecture, in doing so lose electrical potential. The potential loss associated with injection means that the maximum open circuit voltage is lower in a mesoporous architecture.

The trade-off of mesoporous vs. non-mesoporous is that the charges may have to travel further to be separated therefore charge recombination may occur faster. Efficient devices of 19% have been produced by non-mesoporous films, while devices up to 20% have been reported for mesoporous films.

A fourth aspect of the present invention provides an intermediate for use in forming a thin film photoactive layer of an optoelectronic device comprising a substrate having a surface comprising or coated with a metal M selected from at least one of Pb, Sn, Ge, Si, Ti, Bi, or In, wherein the metal surface or metal coating of the substrate is convertible to a perovskite layer by applying at least one perovskite precursor thereto.

This fourth aspect of the present invention relates to the unique metal or metal coated intermediate that can be converted to a perovskite layer by applying at least one perovskite precursor thereto. The preferred conversion process is according to the first aspect of the present invention and it should be understood that the features described above in relation to that aspect of the present invention could equally be incorporated into this aspect of the present invention.

The intermediate of the present invention can have a number of advantageous and characterising properties.

Firstly, in those embodiments where the substrate is coated with a metal M, that coating preferably has a thickness of between 25 and 200 nm, more preferably between 50 and 150 nm. In some forms, that thickness can have a certain profile. For example, in some embodiments the metal coating has a uniform profile substantially across the coated surface of the substrate. In other embodiments, the thickness of metal M on the substrate has a variation of no more than 10 nm, preferably no more than 7 nm, preferably between 5 and 10 nm.

The metal M coating (seed coating) is preferably amorphous or substantially amorphous as determined by XRD. Furthermore, the surface roughness (root mean squared surface roughness) of the intermediate is preferably lower than the surface roughness of the substrate. This difference is preferably at least 2 nm and more preferably at least 3 nm.

Where the metal M is a coating, this uniformity can advantageously result from the particular coating method. For example, electrodeposition can provide highly uniform metal coatings. Whilst not wishing to be limited to any one theory, the inventors consider that this level of thickness uniformity in a perovskite layer cannot be obtained by any other known method. Accordingly, the organo-metal halide perovskite layer produced by the method of the present invention is unique.

As described above, the substrate can have a variety of composition and configurations depending on the final optoelectronic device. In some embodiments, the substrate comprises a conductive substrate coated with a metal M. In some embodiments, the substrate comprises at least one of a polymer, metal, ceramic or glass, preferably a polymer film.

In embodiments, the substrate comprises at least one of: metal, preferably selected from at least one of Pb, Sn, Ge, Si, Ti, Bi, In, Ni, Fe, stainless steel; FTO/ITO glass; glass with a conductive layer; polymer or plastic; or carbons/nanocarbons based substrates. The substrate may include one or more layers or coatings selected from at least one of:

at least one coating of a transparent conductive oxide (TCO);
at least one electrode screening layer;
at least one hole blocking layer;
at least one electron blocking layer;
at least one hole transporting layer; or
at least one electron transporting layer.

Furthermore, the substrate may include the following coatings:

at least one coating of a transparent conductive oxide (TCO) and at least one hole transporting layer applied to the TCO; or
at least one coating of a TCO and at least one electron transporting layer applied to the TCO.

Yet another aspect of the present invention provides an intermediate comprising a metal compound MX$_2$ coating on a substrate for use in forming a thin film photoactive layer of an optoelectronic device comprising a substrate having a surface formed from a metal M coating selected from at least one of Pb, Sn, Ge, Si, Ti, Bi, or In contacted with a vapour X selected from a halide vapour comprising at least one of F, Cl, Br or I, or acetic acid vapour, wherein the metal compound MX$_2$ coating on the coated substrate comprises crystallite having a size of less than 100 nm, preferably between 1 nm and 100 nm, more preferably between 10 nm and 90 nm, and wherein the metal compound MX$_2$ coating on the substrate is convertible to a perovskite layer by applying at least one perovskite precursor thereto.

The surface roughness of the metal compound MX$_2$ coating intermediate is preferably is improved by at least 10%, more preferably by at least 15%, more preferably about 20% improvement in surface roughness over conventional solution based deposition methods such as spin coating or spin casting. In some embodiments, the minimum value in a surface profilometry measurement of the substrate is less than the minimum value in a surface profilometry measurement of metal compound MX$_2$ coating on a substrate by at least 3 nm, preferably at least 5 nm, more preferably at least 7 nm.

A fifth aspect of the present invention provides an organo-metal halide perovskite layer produced from an intermediate comprising a substrate having a surface comprising or coated with a metal M selected from at least one of Pb, Sn, Ge, Si, Ti, Bi, or In, wherein the metal surface or metal coating of the substrate is converted to the perovskite layer by applying at least one perovskite precursor thereto.

This fifth aspect of the present invention relates to the unique perovskite layer produced from the inventive intermediate of the present invention which is produced from that intermediate by applying at least one perovskite precursor thereto. Again, the preferred conversion process is according to the first aspect of the present invention and it should be understood that the features described above in relation to that aspect of the present invention could equally be incorporated into this aspect of the present invention.

In embodiments, the produced organo-metal halide perovskite layer has a morphology substantially matching the morphology of the substrate to which the layer is applied. More particularly, the produced organo-metal halide perovskite layer preferably has a roughness substantially matching the roughness of the substrate to which the layer is applied. In this respect, the layer is applied with such uniformity that the roughness of the underlying substrate is replicated throughout the applied layers. In some embodiments, the RMS (root mean squared) roughness of the perovskite layer of the present invention is preferably within 7 nm more preferably 5 nm of roughness of the substrate on which the organo-metal halide perovskite layer is applied. Furthermore, in embodiments the RMS (root mean squared) roughness is less than 10 nm and preferably less than 5 nm and even more preferably less than 3 nm. Again, Whilst not wishing to be limited to any one theory, the inventors consider that this surface roughness in a perovskite layer cannot be obtained by any other known method. Accordingly, the organo-metal halide perovskite layer produced by the method of the present invention is unique.

A sixth aspect of the present invention provides an organo-metal halide perovskite layer having a roughness substantially matching the roughness of the substrate to which the layer is applied.

This sixth aspect of the present invention relates to the unique perovskite layer of the present invention and the morphology of that layer. In this respect, the layer is applied with such uniformity that the roughness of the underlying substrate is replicated throughout the applied layers. In some embodiments, the RMS (root mean squared) roughness of the perovskite layer of the present invention is preferably within 7 nm more preferably 5 nm of roughness of the substrate on which the organo-metal halide perovskite layer is applied. Furthermore, in embodiments the RMS (root mean squared) roughness is less than 10 nm and preferably less than 5 nm and even more preferably less than 3 nm. Again, whilst not wishing to be limited to any one theory, the inventors consider that this surface roughness in a perovskite layer cannot be obtained by any other known method. Accordingly, the organo-metal halide perovskite layer produced by the method of the present invention is unique. Again, the process of forming this layer is preferably according to the first aspect of the present invention and it should be understood that the features described above in relation to that aspect of the present invention could equally be incorporated into this aspect of the present invention.

It should be appreciated that depending upon the thickness of the layer and the morphology of the substrate—in some embodiments the morphology of the underlying substrate is maintained, while in other embodiments, the coating layers results in an improvement in the roughness of the layer relative to the underlying substrate The organo-metal halide perovskite layer of this sixth aspect preferably forms an optoelectronic device of the second aspect of the present invention and it should be understood that the features described above in relation to that second aspect of the present invention could equally be incorporated into this sixth aspect of the present invention.

A seventh aspect of the present invention provides a method of monitoring the quality of a thin film photoactive layer of an optoelectronic device, comprising the steps of:
applying at least one coating of a metal M selected from at least one of Pb, Sn, Ge, Si, Ti, Bi, or In to a substrate by a deposition method comprising at least one of electrodeposition, electrophoretic deposition, electroplating, or electroless deposition to form a coated substrate; and
converting the metal coating of the coated substrate to a perovskite layer, wherein the deposition method includes a deposition quality control sensor.

Advantageously, each of the deposition method includes a manner of monitoring the quality of the metal M being deposited. In this way, the uniformity and other quality parameters of that layer can be monitored and ensured when applied. The quality of the resulting perovskite layer can therefore be monitored during application of the metal layer M.

A number of deposition quality control sensors can be used. In most cases, the type of deposition quality control sensor depends on the method used. In embodiments, the deposition quality control sensor comprises at least one of applied electrical current or voltage, frequency of the applied electrical signal or measured impedance of the final deposited product.

Some exemplary embodiments of the present invention provide a process of forming a thin film photoactive layer of an optoelectronic device can comprise the steps of:
applying at least one coating of a metal M selected from at least one of Pb, Sn, Ge, Si, Ti, Bi, or In to a substrate to form a coated substrate; and
converting the metal coating of the coated substrate to a perovskite layer,
wherein the at least one coating of a metal M is applied to the substrate by a deposition method comprising at least one of electrodeposition, electrophoretic deposition, electroplating, or electroless deposition.

Other exemplary embodiments of the present invention provide a process of forming a thin film photoactive layer of an optoelectronic device can comprise the steps of:
applying at least one coating of a metal M selected from at least one of Pb, Sn, Ge, Si, Ti, Bi, or In to a substrate to form a coated substrate; and
converting the metal coating of the coated substrate to a perovskite layer,
wherein the at least one coating of a metal M is applied to the substrate by a physical coating method comprising at least one of an evaporative coating method, sputter, or cold spray.

It should be appreciated that the above exemplary embodiments of the invention can include any one of the above discussed features of the above aspects of the present invention, in particular the first, fifth and sixth aspects of the present invention.

BRIEF DESCRIPTION OF THE FIGURES

The present invention will now be described with reference to the figures of the accompanying drawings, which illustrate particular preferred embodiments of the present invention, wherein:

FIG. 1 provides a schematic illustration of the layers comprising a solar cell incorporating a photoactive layer according to the present invention in (A) a conventional solar cell structure; and (B) an inverted solar cell structure.

FIG. 2 provides schematic illustrations of: (a) the generic structure of an embodiment of the optoelectronic device of the present invention; and (b) a layer structure of a photovoltaic cell according to one embodiment of the present invention.

FIG. 12 shows SEM topographic images showing that the deposition of TiOx results in a uniform coating on FTO, comprising (a) FTO (no coating); (b) as a 10 nm coating; (c) as a 20 nm coating; (d) as a 30 nm coating; (e) as a 40 nm coating and (f) or a 50 nm coating.

DETAILED DESCRIPTION

Figure 3:
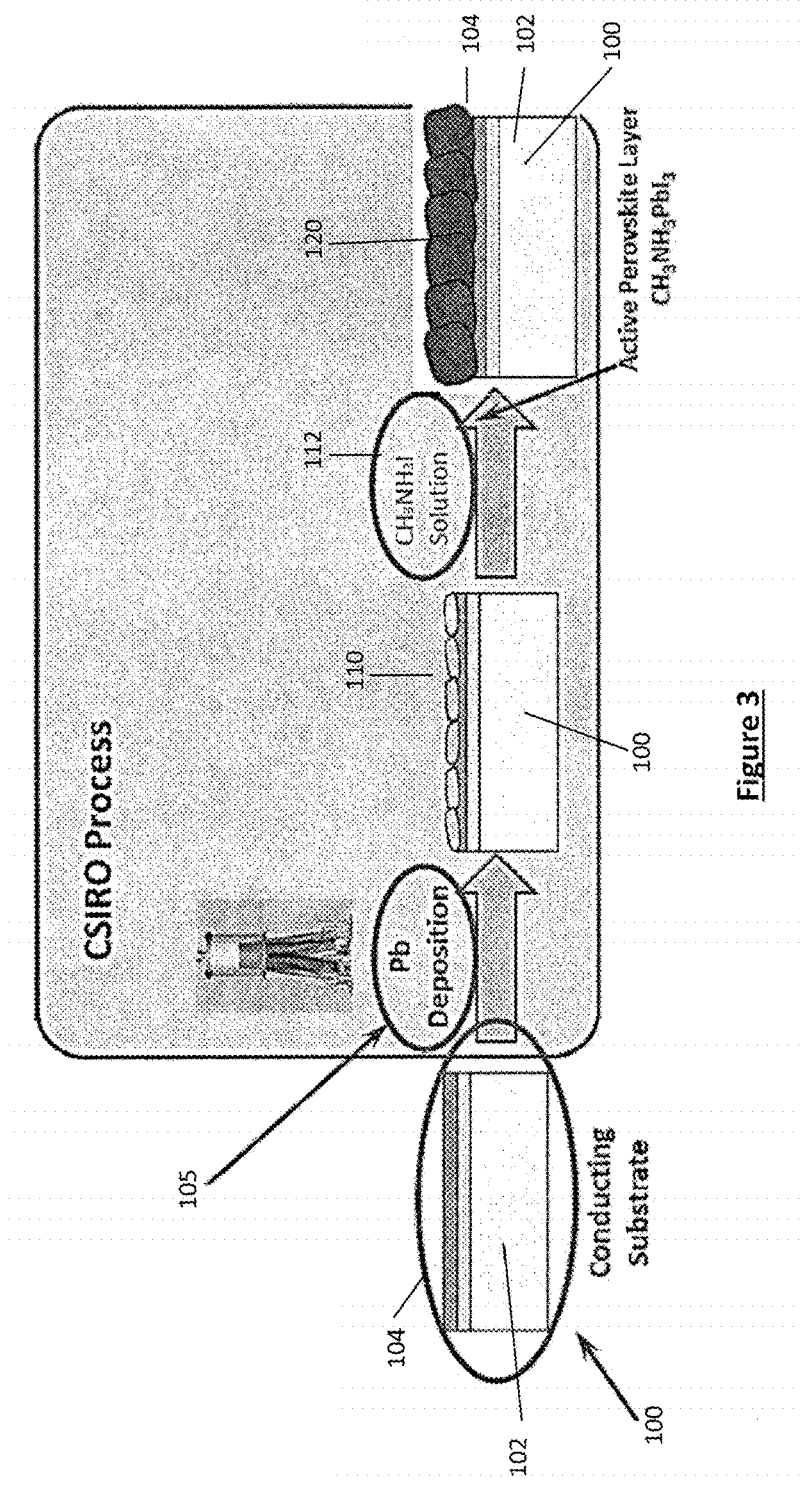
FIG. 3 provides a process flow diagram of a process of forming a photoactive layer according to a first process (one step) embodiment of the present invention.

Optoelectronic device such as photovoltaic cells, particularly thin film and flexible solar cells are formed as a multilayer coating on a substrate. As shown in FIG. 1, this multilayer coating structure can be arranged on the substrate in at least two different arrangements termed in the art as (A) a conventional structure, or (M) as an inverted structure (FIG. 1(B)).

As shown in FIG. 1(A), a conventional structure is formed on a substrate having the following layers successively layered on a surface thereof: a transparent conductive oxide (TCO) layer, followed by a hole transporting layer; followed by the photoactive layer; followed by an electron transporting layer, and followed by a conductor layer (typically a metal).

As shown in FIG. 1(B), an inverted structure is formed on a substrate having the following layers successively layered on a surface thereof: a transparent conductive oxide (TCO) layer, followed by an electron transporting layer; followed by the photoactive layer; followed by a hole transporting layer, and followed by a conductor layer (typically a metal).

Each layer can be formed by one of a number of coating techniques known in the art including evaporation, deposition, electrodeposition, electroless deposition, electrophoretic deposition, vapour deposition, sputter coating, casting, doctor blading, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, dip coating, direct or physical application or the like. It should be appreciated that a person skilled in the art would be able to adopt a suitable technique to apply each layer based on techniques known in the art.

The various layers can comprise a number of suitable components currently known in the art. Examples include:
- Suitable transparent conductive oxides (TCO) include tin doped indium oxide (ITO), fluoride-doped tin oxide (FTO), doped zinc oxide such as aluminium doped zinc oxide(AZO), or indium doped cadmium-oxide;
- Suitable hole transporting layers include a transparent conducting polymer such as at least one of Poly(3,4-ethylenedioxythiophene) (PEDOT), poly(3,4-ethylenedioxythiophene and polystyrene sulfonate mixture (PEDOT:PSS), poly(4,4-dioctylcyclopentadithiophene); doped P3HT (Poly(3-hexylthiophene-2,5-diyl)) or the like;
- Suitable electron transporting layers include zinc oxide, titanium dioxide, tungsten trioxide or the like;
- Suitable conductor layers comprise aluminium, silver, magnesium, copper or suitable alloys thereof or the like; and
- Suitable substrates include metals, polymers, ceramics or glasses.

A generic schematic of the optoelectronic device structure is shown in FIG. 2a. This device can be mounted on any solid substrate material (glass, plastic, metal foil, metal mesh etc.). In FIG. 2a at least one of the metallic electrodes must be transparent/semitransparent (for example: doped or undoped metal oxide, perovskite, polymer, thin metal, metal mesh etc.) whereas the opposite electrode can be transparent/semitransparent or reflective. The light absorbing perovskite, which can be n-type, p-type or intrinsic, is sandwiched between one n-type and one p-type semiconducting layer (organic, inorganic, amorphous-Si, perovskite, hybrid organic/inorganic etc.) for selective electron and hole extraction respectively. The structure shown can be inverted.

Multijunction cells can also be produced using the process of the present invention. Multijunction cells can be produced by layering a series of perovskite structures (for instance, successive halide substitution in the series I, Cl, Br, F or combinations thereof) which vary in bandgap and hence spectral sensitivity to facilitate broader spectral response within the device. In the embodiment of the optoelectronic device as a photovoltaic cell, these may be formed from multiple junctions of perovskite materials or top-cell junctions with common semiconductors used by those knowledgeable in the art, for instance monocrystalline silicon or polycrystalline silicon.

Certain embodiments of the optoelectronic device of the invention have the specific structure shown in FIG. 2b.

The present invention provides method of forming a photoactive layer and a photoactive layer of the optoelectronic devices shown in FIGS. 1 and 2 and an intermediate which can be used in that method to form optoelectronic devices. The photoactive layer is in a photoactive region of that device. As shown in FIGS. 1 and 2a, the photoactive region typically comprises: an electron-transporting (n-type region) comprising at least one n-type layer; a hole-transporting (p-type) region comprising at least one p-type layer; and, disposed between the electron-transporting region and the hole-transporting region: a layer of a perovskite semiconductor.

The term "photoactive region", as used herein, refers to a region in the optoelectronic device which (i) absorbs light, which may then generate free charge carriers; or (ii) accepts charge, both electrons and holes, which may subsequently recombine and emit light.

The skilled person will appreciate that a perovskite material can be represented by the formula [A][M][X]$_3$, wherein [A] is at least one cation, [M] is at least one cation and [X] is at least one anion. When the perovskite comprise more than one A cation, the different A cations may distributed over the A sites in an ordered or disordered way. When the perovskite comprises more than one M cation, the different M cations may distributed over the M sites in an ordered or disordered way. When the perovskite comprise more than one X anion, the different X anions may be distributed over the X sites in an ordered or disordered way. The symmetry of a perovskite comprising more than one A cation, more than one M cation or more than one X cation, will be lower than that of CaTiO$_3$. A perovskite is a crystalline compound. Thus, the layer of the perovskite semiconductor without open porosity typically consists essentially of crystallites of the perovskite.

As mentioned in the preceding paragraph, the term "perovskite", as used herein, refers to (a) a material with a three-dimensional crystal structure related to that of CaTiO$_3$ or (b) a material comprising a layer of material, wherein the layer has a structure related to that of CaTiO$_3$. Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is [2-(I-cyclohexenyl)ethylammonium]2PbBr$_4$. 2D layered perovskites tend to have high exciton binding energies, which favours the generation of bound electron-hole pairs (excitons), rather than free charge carriers, under photoexcitation. The bound electron-hole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the present invention is preferably a perovskite of the first category, (a), i.e. a perovskite which has a three-dimensional crystal structure. This is particularly preferable when the optoelectronic device is a photovoltaic device.

In order to provide highly efficient photovoltaic devices, the absorption of the absorber/photoactive region should ideally be maximised so as to generate an optimal amount of current. Consequently, when using a perovskite as the absorber in a solar cell, the thickness of the perovskite layer should ideally be in the order of from 300 to 600 nm, in order to absorb most of the sun light across the visible spectrum. In particular, in a solar cell the perovskite layer should generally be thicker than the absorption depth (which is defined as the thickness of film required to absorb 90% of the incident light of a given wavelength, which for the perovskite materials of interest is typically above 100 nm if significant light absorption is required across the whole visible spectrum (400 to 800 nm)), as the use of a photoactive layer in photovoltaic devices with a thickness of less than 100 nm can be detrimental to the performance of the device.

In contrast, electroluminescent (light-emitting) devices do not need to absorb light and are therefore not constrained by the absorption depth. Moreover, in practice the p-type and n-type contacts of electroluminescent devices are typically chosen such that once an electron or hole is injected on one side of the device it will not flow out of the other (i.e. they are selected so as to only inject or collect a single carrier), irrespective of the thickness of the photoactive layer. In essence, the charge carriers are blocked from transferring out of the photoactive region and will thereby be available to recombine and generate photons, and can therefore make use of a photoactive region that is significantly thinner.

As used herein, the term "thickness" refers to the average thickness of a component of an optoelectronic device. Typically, therefore, when the optoelectronic device is a photovoltaic device, the thickness of the perovskite layer is greater than 100 nm. The thickness of the perovskite layer in the photovoltaic device may for instance be from 100 nm to 100 μm, or for instance from 100 nm to 700 nm. The thickness of the perovskite layer in the photovoltaic device may for instance be from 200 nm to 100 μm, or for instance from 200 nm to 700 nm.

In a perovskite type photoactive device, such as a photovoltaic cell, the photoactive layer comprises an organic-inorganic perovskite-structured semiconductor. The present invention provides a process of forming a photoactive layer of a perovskite type photoactive device. The photoactive layer formed by the present invention can be formed using two distinct method steps:

Step One

Step one involves the provision of a suitable intermediate comprising a substrate which comprises the required metal M or has a metal coating M applied thereto, in which the metal M is selected from at least one of Pb, Sn, Ge, Si, Ti, Bi, or In. Where the substrate comprises the metal M, it is typically a thin film of that metal.

In some embodiments, the process can also include the application of the metal to a suitable substrate, thereby forming an intermediate suitable for the process of the present invention. In this step, at least one coating of a metal M selected from at least one of Pb, Sn, Ge, Si, Ti, Bi, or In is applied to a substrate to form a coated substrate. The substrate can be any suitable layer from the photoactive device, such as a metal layer, stainless steel, Ti, Ni mesh, FTO/ITO glass, glass with deposited conductor, PET/polymer, Carbons/nanocarbons or the like. The metal is applied to a layer of that substrate using a suitable metal deposition technique. Suitable techniques include at least one of: a deposition method such as electrodeposition, electrophoretic deposition, electroplating, or electroless deposition; a physical coating method such as sputter coating, cold spray; or application of solid film or layer to the substrate; or an evaporative coating method.

Evaporation or evaporative deposition is a method of thin-film deposition in which the source material, in the case of the present invention metal M, is evaporated in a vacuum or reduced pressure. Ideally vapours other than the source material are almost entirely removed before the process begins. The vacuum allows vapour particles to travel directly to the target substrate surface, where the metal particles condense back to a solid state. All evaporation systems include a vacuum pump and energy source that evaporates the material to be deposited. Energy sources include heated semimetal (ceramic) evaporators in which a pool of melted metal forms and evaporates into a cloud above the source; radiatively heated crucible; molecular beam epitaxy; electron beam heating; flash evaporation, in which a fine wire of source material is fed continuously onto a hot ceramic bar, and evaporates on contact; resistive evaporation accomplished by passing a large current through a resistive wire or foil containing the material to be deposited; or the like. It is to be understood that a variety of suitable evaporative deposition equipment is commercially available and could be used for the metal application/coating step of the process of the present invention.

Sputter deposition is a physical vapour deposition (PVD) method involving ejecting material from a source onto a substrate housed in a vacuum chamber to form a thin film of the sputter material on a target surface of the substrate. For the present invention, the sputtered atoms would comprise metal atom M, as defined above. Sputtered atoms ejected from the target have a wide energy distribution, typically up to tens of eV (100,000 K). The sputtered ions (typically only a small fraction—in the order of 1%—of the ejected particles are ionized) can ballistically fly from the target in straight lines and impact energetically on the substrates or vacuum chamber (causing resputtering). Alternatively, at higher gas pressures, the ions collide with the gas atoms that act as a moderator and move diffusively, reaching the substrates or vacuum chamber wall and condensing after undergoing a random walk. As can be appreciated, a number of parameters (gas pressure, temperature, pressure, voltage and the like) can be varied to control sputter deposition. However, this technique can provide a large degree of control over the growth and microstructure of the film. It is to be understood that a variety of suitable sputter deposition equipment is commercially available and could be used for the metal application/coating step of the process of the present invention.

Electrodeposition or electroplating uses electric current to reduce dissolved metal cations so that they form a coherent metal coating on an electrode. The conducting substrate to be plated forms the cathode of the circuit. The anode can be made of the metal to be plated on the substrate, or another conducting material. The anode and cathode (substrate) are immersed in an electrolyte solution containing one or more dissolved metal salts (typically metal salts of the desired metal M to be coated on the substrate) as well as other ions that permit the flow of electricity. A power supply supplies a direct current to the anode, oxidizing the metal atoms that it comprises and allowing them to dissolve in the solution. At the cathode, the dissolved metal ions in the electrolyte solution are reduced at the interface between the solution and the cathode, such that they "plate out" onto the cathode. The rate at which the anode is dissolved is equal to the rate at which the cathode is plated, vis-a-vis the current through the circuit. In this manner, the ions in the electrolyte bath are continuously replenished by the anode. It is to be understood that a variety of suitable electrodeposition equipment is commercially available and could be used for the metal application/coating step of the process of the present invention.

Furthermore, it should be appreciated that selected additives and surfactants can significantly influence the morphology in electrodeposition. It should be appreciated that any electrodeposition process used in the present invention may use of such additives to obtain optimal metal coating layers. For example in some embodiments, the electrolyte will contain a metal precursor for deposition including simple salts (for instance, $Pb(BF_4)_2$, $Pb(acetate)_2$ or $Pb(NO_3)_2$ and the like) or coordination compounds of the desired metal (lead gluconate and the like) dissolved in solution. In addition to the dissolved metal precursor, a supporting electrolyte consisting of a soluble inert salt ($KNO_3$, $NH_4NO_3$, $NH_4(acetate)$ and the like) to avoid large electrolyte resistance or other ionic species such as a strong acid or base (e.g., $HNO_3$, KOH and the like). Where concentrations of metal precursor are used are sufficiently high to minimise resistance losses in the solution, the metal precursor itself may simultaneously act as the supporting electrolyte.

In addition to the metal precursor and supporting electrolyte, the electrolyte may contain certain additives to promote deposition of seed morphologies with favourable structures. For instance, the use of surface-active agents (surfactants) including neutral surfactants (poly-ethylene glycol, Triton X-100 and the like) cationic head group (cetyltrimethylammonium bromide and the like), or anionic head group (sodium dodecyl sulphate and the like). Other additives include $H_3B0_3$ and its various conjugate bases, $NH_4F$, NaF, $H_3PO_4$ or other phosphate salts and the like may be included to induce favourable seed morphology. Furthermore, the control of solution pH with acids, bases and buffers may be used to modify the deposition of the seed deposit.

For example, in one exemplary embodiment, electrodeposition is used to coat a layer of metal on a substrate. Here the substrate is used as a cathode in an electrodeposition arrangement. The substrate must be conducting substrate to form an electrode, for example a metal substrate or a metal coated substrate, for example $TiO_2$-coated FTO glass. The conductive substrate is placed in a lead or other suitable metal containing solution, with a corresponding anode spaced apart from the cathode, resulting in Pb (or other metal) deposition. Persons skilled in the art will know there are many options for solution composition, pH, deposition potential or current, temperature, surface-active additives, metal compounds etc. which can influence the optimisation of an electrodeposition process. The electrodeposited layer provides a suitable mesoporous template for conversion to a photoactive perovskite layer.

Electrophoretic deposition (EPD) involves submerging the substrate (in this case a conducting substrate) into a container or vessel which holds a coating bath or solution and applying direct current electricity through the coating bath using electrodes. The conductive substrate is one of the electrodes, and a set of "counter-electrodes" are used to complete the circuit. Typically voltages of 25-400 volts DC are used in electrocoating or electrophoretic applications. The bath typically is formed from colloidal particles suspended in a liquid medium migrate under the influence of an electric field (electrophoresis) and are deposited onto the substrate. The materials which are being deposited are the major determining factor in the actual processing conditions and equipment which may be used.

Electroless deposition or electroless plating uses a redox reaction to deposit metal on a substrate without the passage of an electric current. The technique involves reduction of a complexed metal using a mild reducing agent, such as formaldehyde. Electroless deposition allows a constant metal ion concentration to bathe all parts of the substrate, thereby depositing metal evenly on the substrate. It is to be understood that a variety of suitable electroless deposition is commercially available and could be used for the metal application/coating step of the process of the present invention.

Cold spray coating involves the acceleration of solid powders in a supersonic gas jet and subsequent impact with the substrate, to plastically deform and adheres those particles to the surface of that substrate. Subsequent particle impacts cause the particles to adhere to each other and form an overlap deposit comprising the coating over the surface of the substrate. The coating comprises a plurality of particles forming a distinct layer over the surface of the particle. Adhesion of the coating is by mechanical bonding or local fusion to the substrate surface. For the present invention, a surface of the substrate would be coated using solid powders of the requisite metal M selected from at least one of Pb, Sn, Ge, Si, Ti, Bi, or In accelerated at that surface using suitable cold spray coating equipment. It is to be understood that a variety of suitable cold spray coating equipment is commercially available and could be used for the metal application/coating step of the process of the present invention.

In yet other embodiments, a thin metal film of the requisite metal M can be adhered to, melted or otherwise applied onto a suitable surface of a substrate.

Step Two

Step two involves converting the metal surface/layer of the intermediate (i.e. the comprising metal surface or coated metal layer) to a perovskite layer. In step two, a perovskite precursor is applied to the metal surface or a converted form of the metal layer to convert the metal layer to a photoactive perovskite layer.

Conversion of the metal surface of the intermediate may involve:
(i) direct reaction of the metal layer into the photoactive Perovskite layer; and/or
(ii) one or more intermediate steps in which the metal layer is converted into different species (oxidation or halogenation or the like) which in turn can be reacted with a perovskite precursor to form a photoactive perovskite layer.

FIG. 3 illustrates a first embodiment ("one step") of the conversion process in which the coated metal layer 110 of a coated substrate (the intermediate) 100 is converted into a perovskite layer. In this process, a substrate 100 undergoes the coating deposition step 105 as described above to deposit a metal coating layer 110 thereon. The substrate 100 includes a film layer 102 (for example plastic) and functional layers 104 such as a transparent conductive oxide (TCO) layer and either a hole transporting layer(s) or electron transporting layer(s) prior to coating with the metal layer 110. Subsequently, that metal coating layer 110 is directly reacted with a perovskite precursor solution or vapour in conversion step 112 to form the photoactive Perovskite layer 120.

Where a solution is used, the perovskite precursor compound is dissolved in a coating solvent. The coating solvent for the AX "perovskite precursor salts" preferably comprise solvents in which $PbI_2$ is insoluble, such as isopropanol or other alcohols, alcohol blends or similar.

For example, in one embodiment, the metal deposited layer, for example Pb, is immersed or otherwise coated with a perovskite precursor solution, such as $CH_3NH_3I$ and $CH_3NH_3Cl$ dissolved in a solvent (for example anhydrous isopropanol or other alcohol blends) to form the photoactive Perovskite layer $(CH_3NH_3)PbI_{3-x}Cl_x$. In a second embodiment, the metal deposited layer, for example Pb, is immersed in a solution of $CH_3NH_3I$ and $CH_3NH_3Cl$ in a solvent (for example anhydrous isopropanol or other alcohol blends) together with a low concentration of an acid such as acetic acid to facilitate transition via decreased pH and formation of the acetate conjugate base as an iodo salt.

The perovskite precursor solution can be applied to the metal coated substrate by any number of suitable application techniques. Suitable techniques for applying the applied coating to the substrate include, but should not be limited to, at least one of: casting, doctor blading, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, slip coating or dip coating.

In some embodiments, the perovskite precursor solution is applied by spin-coating followed by thermal annealing.

The perovskite precursor may alternatively or also be applied using a vapour deposition process in which a perovskite precursor vapour is reacted directly with the metal coating of the coated substrate. The precursor vapour typically comprises at least one perovskite precursor or one or more reactants for producing said perovskite precursor. This process is described in more detail below.

Figure 4:
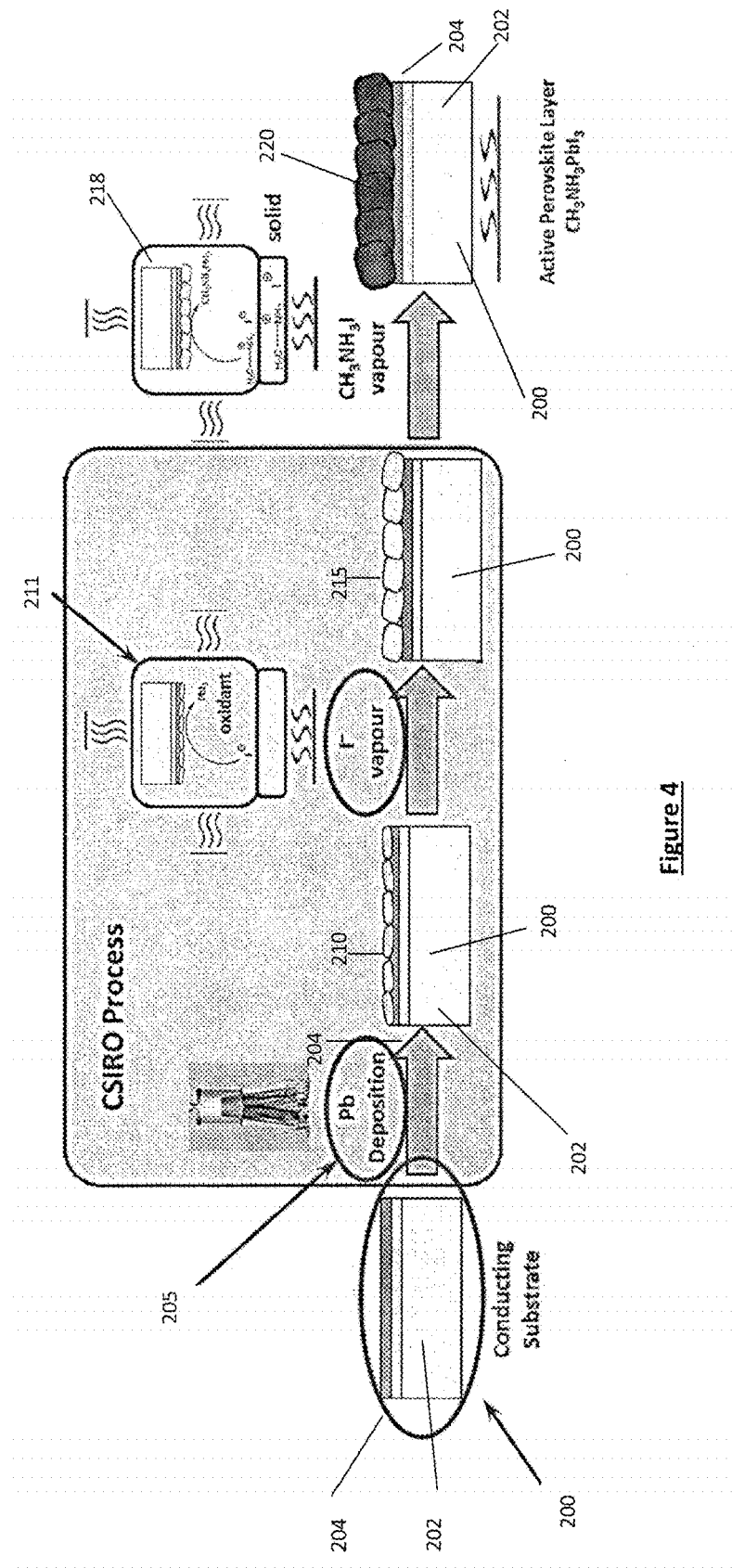
FIG. 4 provides a process flow diagram of a process of forming a photoactive layer according to a second process (two step) embodiment of the present invention.

FIG. 4 illustrates a second embodiment ("two step") of the conversion process in which the coated metal layer 210 of a coated substrate (i.e. the intermediate) 200 is converted into a perovskite layer. In this process, a substrate 200 undergoes the coating deposition step 205 as described above to deposit a metal coating layer 210 thereon. Again, the substrate 200 includes a film layer 202 (for example plastic) and functional layers 204 such as a transparent conductive oxide (TCO) layer and either a hole transporting layer(s) or electron transporting layer(s) prior to coating with the metal layer 210. The metal coating layer 210 of the substrate 200 is then reacted with a halide vapour 211 (for example selected from at least one of F, Cl, Br or I) to form a metal halide $MX_2$ coating 215 on the coated substrate 200. Subsequently, that metal halide coating layer 215 is reacted with a perovskite precursor solution or vapour in a final conversion step 218 to form the photoactive Perovskite layer 220 on the substrate 200.

As shown in FIG. 4, halogenation of the metal layer occurs in a reactor, such as a bomb type reactor halide between 50 and 200° C., preferably between 75 and 150° C. It is noted that the pressure in the bomb reaction would typically be greater than ambient pressure. Halide vapour results from halide containing solution such as KCl, KI, HCL, HBr; halide salts such as (add); $CH_3NH_3X$; Eutectic melts; RTIL eutectic melts, or halide solids such as $I_2$, $CH_3NH_3X$ contact and react with the metal layer to form a metal halide layer.

The metal halide layer can then be reacted with a perovskite precursor solution, such as $CH_3NH_3I$ and $CH_3NH_3Cl$ dissolved in a solvent (for example anhydrous isopropanol or other alcohol blends) to form the photoactive Perovskite layer $(CH_3NH_3)PbI_{3-x}Cl_x$.

In other embodiments, the metal layer is reacted with acetic acid vapour thereby forming a metal acetate intermediate layer (for example $Pb(CH_3COO)_2$ when the metal M is lead), which can then be converted to the active perovskite film, for example via a solution/vapour diffusion process.

Alternatively, the perovskite layer can be formed by vapour deposition process in which the metal halide layer is exposed to a perovskite precursor vapour, thereby allowing deposition of the perovskite precursor vapour onto the metal halide $MX_2$ coating on the coated substrate, to produce a perovskite layer thereon. The perovskite precursor vapour typically comprises least one perovskite precursor or one or more reactants for producing said perovskite precursor vapour deposition is typically allowed to continue until the solid layer of perovskite has a thickness of from 100 nm to 100 μm, and preferably from 100 nm to 700 nm.

Vapour deposition is a well understood process, and has been previously used for forming perovskite layers from metal halide layers, for example as taught in WO2014045021A1 the contents of which should be understood to be incorporated into this specification by this reference. In this process, generally comprises producing the perovskite precursor vapour by evaporating said perovskite or evaporating said one or more reactants for producing said perovskite. In this step the perovskite or the one or more reactants for producing the perovskite can be transferred to an evaporation chamber which is subsequently evacuated. The perovskite or the one or more reactants for producing the perovskite are then heated. The resulting vapour is then exposed to the metal coating of the coated substrate and thereby deposited therein, to produce a solid layer of said perovskite thereon. If reactants are used, these react together in situ to produce the perovskite on the substrate. Vapour deposition is allowed to continue until the solid layer of perovskite has a desired thickness, for instance a thickness of from 10 nm to 100 μm, or more typically from 10 nm to 10 μm.

Deposition methods of inorganic perovskite have been well researched, such as pulsed-laser deposition and chemical solution deposition. The hybrid inorganic-organic perovskite, such as $(C_6H_5C_2H_4NH_3)_2PbI_4$ or $(C_6H_5C_2H_4NH_3)_2PbBr_4$, have been successfully evaporated through single source thermal deposition. However, since the deposition methods of the hybrid inorganic-organic perovskite were rarely mentioned because of the significant difference in physical and chemical properties between the inorganic and organic materials, the dual-source thermal deposition was applied to evaporate the organic source and inorganic source simultaneously but with independent control (V. K. Dwivedi, J. J. Baumberg, and G. V. Prakash, "Direct deposition of inorganic-organic hybrid semiconductors and their template-assisted microstructures," Materials Chemistry and Physics, vol. 137, no. 3, pp. 941-946, January 2013).

As discussed previously, a large number of perovskite precursors can be used in the present invention for forming the perovskite layer. The perovskite precursor (for solution treatment, vapour deposition or the like as detailed above) generally comprises at least one compound having the formula AX, or at least one reaction constituent for forming at least one compound having the formula AX, in which A comprises an ammonium group or other nitrogen containing organic cation and X is selected from at least one of F, Cl, Br or I. Suitable examples are broadly detailed above in the summary of invention section. In exemplary embodiments, the perovskite precursor comprises an organo-lead Iodide and/or Chloride perovskite precursor. As discussed above, A can be selected from a large number of ammonium or nitrogen containing organic cations. In some embodiments, A comprises cations having the general formula $RCH_2NH_3^+$, $RC(NH_2)_2^+$, $R_aR_bCH_1NH_3^+$, $R_aR_bR_cCNH_3^+$, $R_aR_bNH_2^+$, or $R_aR_bR_cNH^+$, where R, $R_a$, $R_b$, $R_c$ comprises H or a substituted or unsubstituted alkyl group or groups, preferably a $C_1$ to $C_6$ substituted or unsubstituted alkyl or aryl group or groups.

Whilst a number of organo-metal halide perovskite are possible, preferably A comprises at least one of $CH_3NH_3^+$, or $HC(NH_2)_2^+$. Thus, in some embodiments the perovskite precursor AX is selected from the group consisting of $CH_3NH_3X$ and $HC(NH_2)_2X$, and wherein X is selected from at least one of F, Cl, Br or I. For example, perovskite precursor may comprise a mixture of $CH_3NH_3Cl$ and $CH_3NH_3I$. Accordingly, in preferred embodiments AX comprises $CH_3NH_3X$.

Whilst FIGS. 3 and 4 show the process of the present invention using a coated substrate, it should be appreciated that the process could equally be used on a selected surface of a thin metal substrate, preferably thin film metal substrate formed from the requisite metal M.

EXAMPLES

Example 1—Electrochemical Deposition of Pb Thin Film Seed Layer for Planar Perovskite Solar Cells In this example, a thin metallic Pb seed layer is electrochemically deposited on an n-type compact blocking layer, in this case $TiO_2$, as a precursor for a perovskite solar cell. The deposited Pb seed layer is then chemically converted to the photoactive perovskite material.

It should be appreciated that whist demonstrated for planar perovskite solar cells, the method and techniques exemplified can equally be applied to non-planar perovskite solar cells configurations for example the inclusion of a mesoscopic thin-film of nanoparticles for example $TiO_2$, $Al_2O_3$, $ZrO_2$ or the like.

1.1 Electrochemical Deposition of Pb

The electrochemical deposition equipment included the following:

An electrolyte consisting of a 0.01 mol/L solution of $Pb(NO_3)_2$ as Pb source and 0.1 mol/L $KNO_3$ as inert conducting electrolyte (also known as supporting electrolyte.

A working electrode (that where the reaction of interest takes place—Pb electrodeposition) consisting of a $TiO_2$-modified fluorine-doped tin oxide (FTO) substrate. The FTO pattern of the electrode was previously modified with a laser ablation system to give a defined area for Pb deposition. The $TiO_2$ modification forms the compact hole-blocking layer in the completed cell. In our example, the $TiO_2$ is deposited by spin coating a solution of 0.5 mol/L titanium(IV) tetraisopropoxide precursor in 1-butanol acidified with 0.35 mol/L glacial acetic acid. The deposition is carried out at 4000 rpm for 15 seconds. The titanium isopropoxide is cleaned from the FTO electrical contact areas by removal with a pen filled with 1-butanol solvent. The substrate is then heated to 120° C. for 1 h, before being sintered at 500° C. for 30 min.

A counter electrode comprising a catalytic Pt-modified FTO sample. It is noted that the counter electrode material must be catalytic, and so any other metal inert to corrosion could also be used.

A reference electrode was used to provide a fixed reference potential point from which the potential of the working electrode can be modified in order to bring about the desired electrochemical deposition. In this example, a commercial saturated calomel electrode (SCE) was used. The potentials defined will be referenced to this potential.

In our electrochemical cell the distance between the working and counter electrodes was ca. 3 cm. The reference electrode was situated midway between the two electrodes, with care taken to not block ionic transport between the electrodes.

Figure 5:
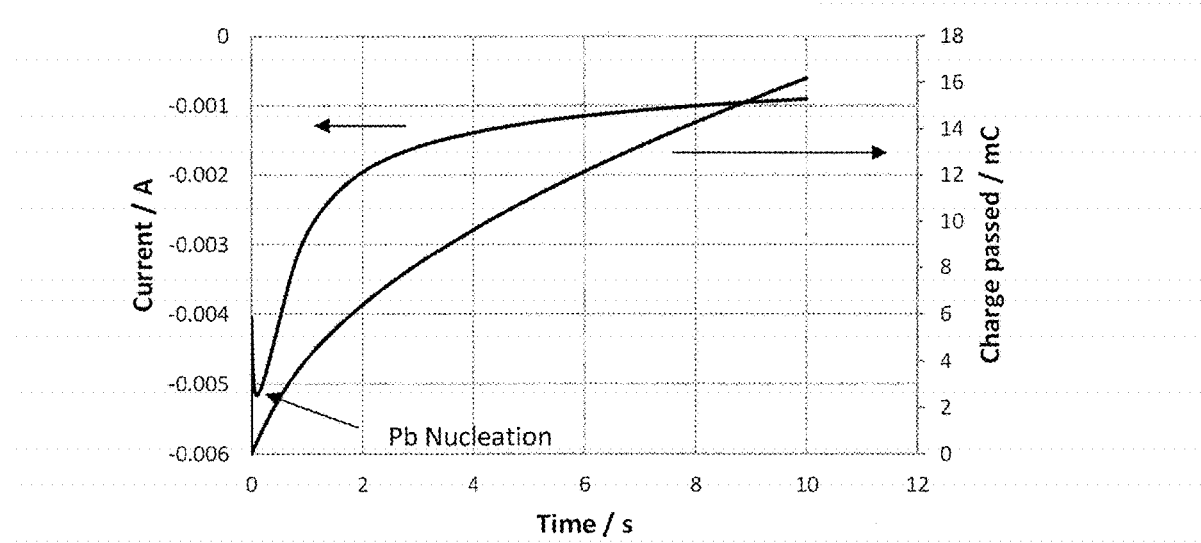
FIG. 5 provides a graph of typical chronoamperometric deposition data for electrochemical deposition of a lead (Pb) seed layer.

The technique of chronoamperometry (literally, time-current or measure current vs time at a fixed potential) was used to deposit the Pb film seed layer. The electrochemical deposition of Pb was carried out at room temperature at −0.85 V vs. SCE for 100 seconds. FIG. 5 provides a plot of typical chronoamperometric deposition data for this electrochemical deposition of Pb.

1.2 Conversion to $CH_3NH_3PbI_3$ Photoactive Perovskite Material

The Pb seed layer was chemically converted to the perovskite layer through application (dipping) the Pb coated substrate in a solution of $CH_3NH_3I$ (10 mg/mL), Acetic acid ($2\times10^{-3}$ mol/L) in anhydrous isopropanol for 1 min to convert to $CH_3NH_3PbI_3$. It should be appreciated that alternative cations ($CH_3NH_3^+$, $Cs^+$, formamidinium etc) and anions ($Br^-$, $Cl^-$ etc) are also possible. Substrates were removed and rinsed with isopropanol.

1.3 Photovoltaic Cell Fabrication

Under glovebox conditions (<1 ppm $O_2$ and $H_2O$) a solution of 0.068 mol/L spiro-OMeTAD hole transport material, 0.055 M 4-tertbutyl pyridine and $9\times10^{-3}$ mol/L Li TFSI additives was prepared and spun cast at 2000 rpm for 30 seconds. To complete the cell, a 90 nm gold cathode and contact were thermally evaporated under high vacuum.

1.4 Cell Performance

Figure 6:
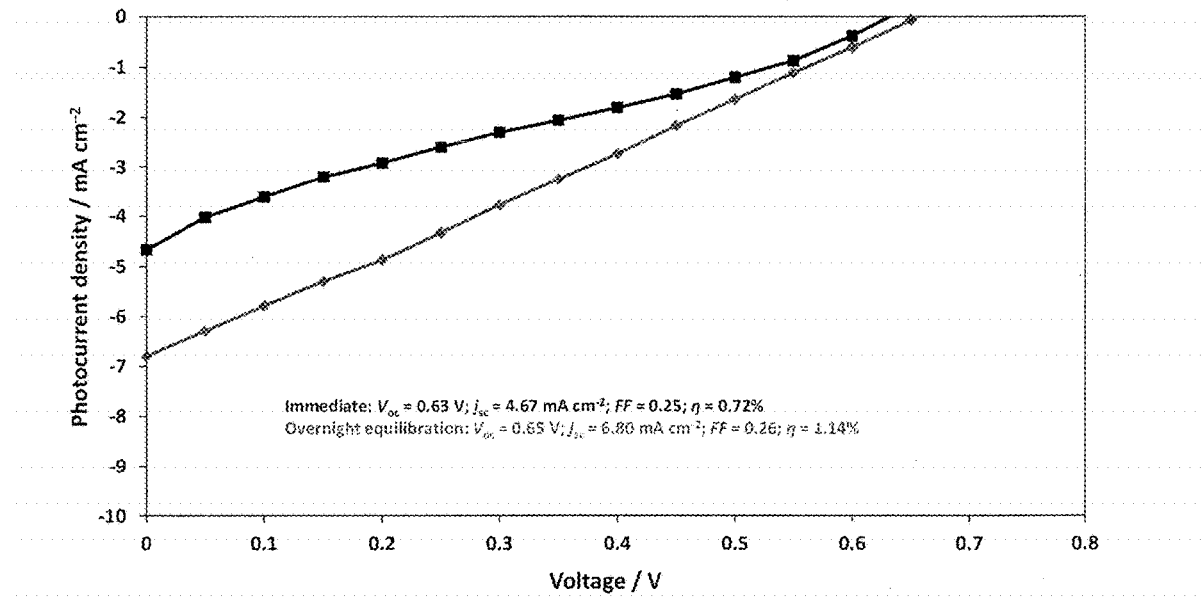
FIG. 6 provides an I-V curve for the planar perovskite solar cell prepared via electrochemical deposition of a lead (Pb) seed layer.

FIG. 6 provides the I-V curve for the planar perovskite solar cell prepared via electrochemical deposition of a lead seed layer.

Example 2—Thermal Evaporation of Thin Pb Film as Perovskite Seed Layer for Planar Perovskite Solar Cells In the following two examples (2.1 and 2.2), a thin metallic Pb seed layer is formed by thermal evaporation of Pb and condensation onto an n-type compact blocking layer (in this example either ZnO or $TiO_2$) as a precursor for a perovskite solar cell. The seed layer once deposited is then chemically converted to the photoactive perovskite material.

2.1 ZnO Blocking Layer on Indium-Doped Tin Oxide (ITO) Substrate Embodiment 2.1.1 Substrate Preparation The ITO substrate was cleaned by successive sonication treatments in detergent (Hellmanex, 1% in milli-W water), pure milli-Q water and isopropanol.

ZnO blocking layer was applied by spin casting a suspension of ZnO nanoparticles in 1-butanol onto the cleaned ITO substrate. The film was annealed at 100° C. After annealing, the ZnO film was treated by plasma treatment for 1 hour. This was necessary for film stability.

2.1.2 Pb Seed Layer Deposition

Metallic Pb was deposited by thermal evaporation under high vacuum conditions. 75 nm of Pb was deposited at 0.5 nm/s.

2.1.3 Conversion to $PbI_2$.

The $PbI_2$ film was treated to an iodine vapour/nitrogen atmosphere at 70° C. for 1 hour to tarnish the Pb film to $PbI_2$. Films were removed and washed with isopropanol to remove residual $I_2$.

2.1.4 Conversion to Photoactive Perovskite.

In a glovebox atmosphere, a solution of $CH_3NH_3I$ in isopropanol was spun-cast to deposit a layer of the solid atop the $PbI_2/CH_3NH_3PbI_3$ film. The film was then annealed at 80° C. for 15 min to complete the conversion to perovskite. The film was rinsed with isopropanol to remove residual $CH_3NH_3I$.

2.1.5 Photovoltaic Cell Fabrication

In a glovebox atmosphere, a solution of 20 mg/mL P3HT polymer hole transport material in chlorobenzene was spun cast atop the perovskite film at 2000 rpm. The contacts were cleaned, before evaporation of a 80 nm thick layer of Ag as the cathode.

2.1.6 Performance

Figure 7:
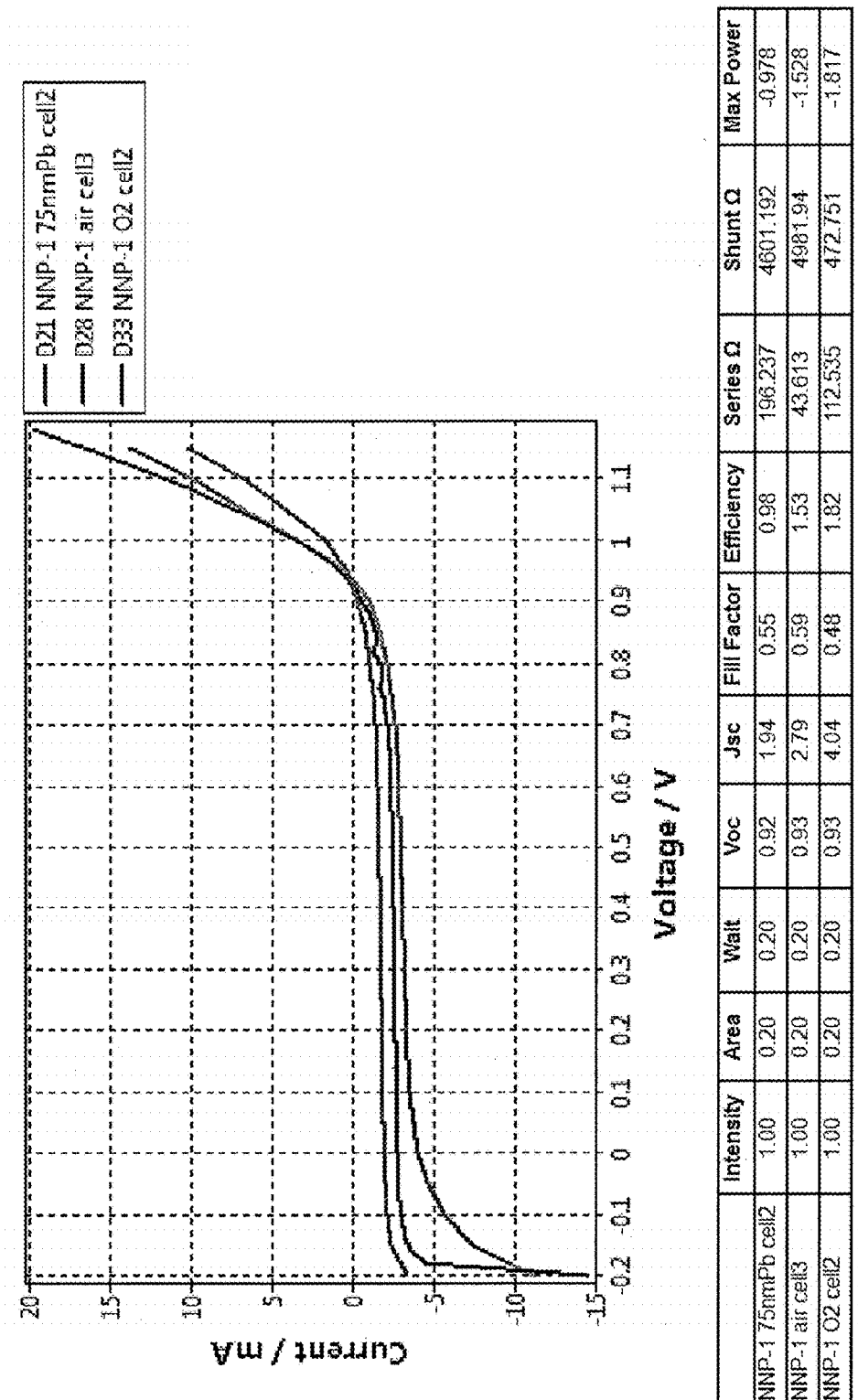
FIG. 7 provides I-V curves of the evaporated Pb on ZnO/ITO embodiment.

FIG. 7 provides that I-V curves of the evaporated Pb on ZnO|ITO embodiment. Note the Y-axis of this printout is $mA/cm^2$ (current density) and not mA (raw current).

2.2 $TiO_2$ Blocking Layer on FTO Substrate Embodiment 2.2.1 Substrate Preparation The FTO substrate was cleaned by successive sonication treatments in detergent (Hellmanex, 1% in milli-W water), pure milli-Q water and isopropanol.

$TiO_2$ blocking layer was applied by screen printing a commercial Ti-containing blocking layer solution (BL-1; Dyesol) onto the cleaned FTO substrate. The film was dried at 90° C. before being sintered at 500° C. for 30 min. The film was then treated to a solution of $TiCl_4$ (0.02 mol/L in milli-Q water) for 30 min at 70° C. The film was subsequently sintered again using the same process.

2.2.2 Pb Seed Layer Deposition

Metallic Pb was deposited by thermal evaporation a under high vacuum conditions. 50 nm of Pb was deposited at 0.5 nm/s.

2.2.3 Conversion to $PbI_2$

The $PbI_2$ film was treated to an iodine vapour/nitrogen atmosphere at 70° C. for 1 hour to tarnish the Pb film to $PbI_2$. Films were removed and washed with isopropanol to remove residual $I_2$.

2.2.4 Conversion to Photoactive Perovskite

In a glovebox atmosphere, a solution of $CH_3NH_3I$ in isopropanol was spun-cast to deposit a layer of the solid atop the $PbI_2/CH_3NH_3PbI_3$ film. The film was then annealed at 100° C. for 15-30 min to complete the conversion to perovskite. The film was rinsed with isopropanol to remove residual $CH_3NH_3I$.

Figure 8:
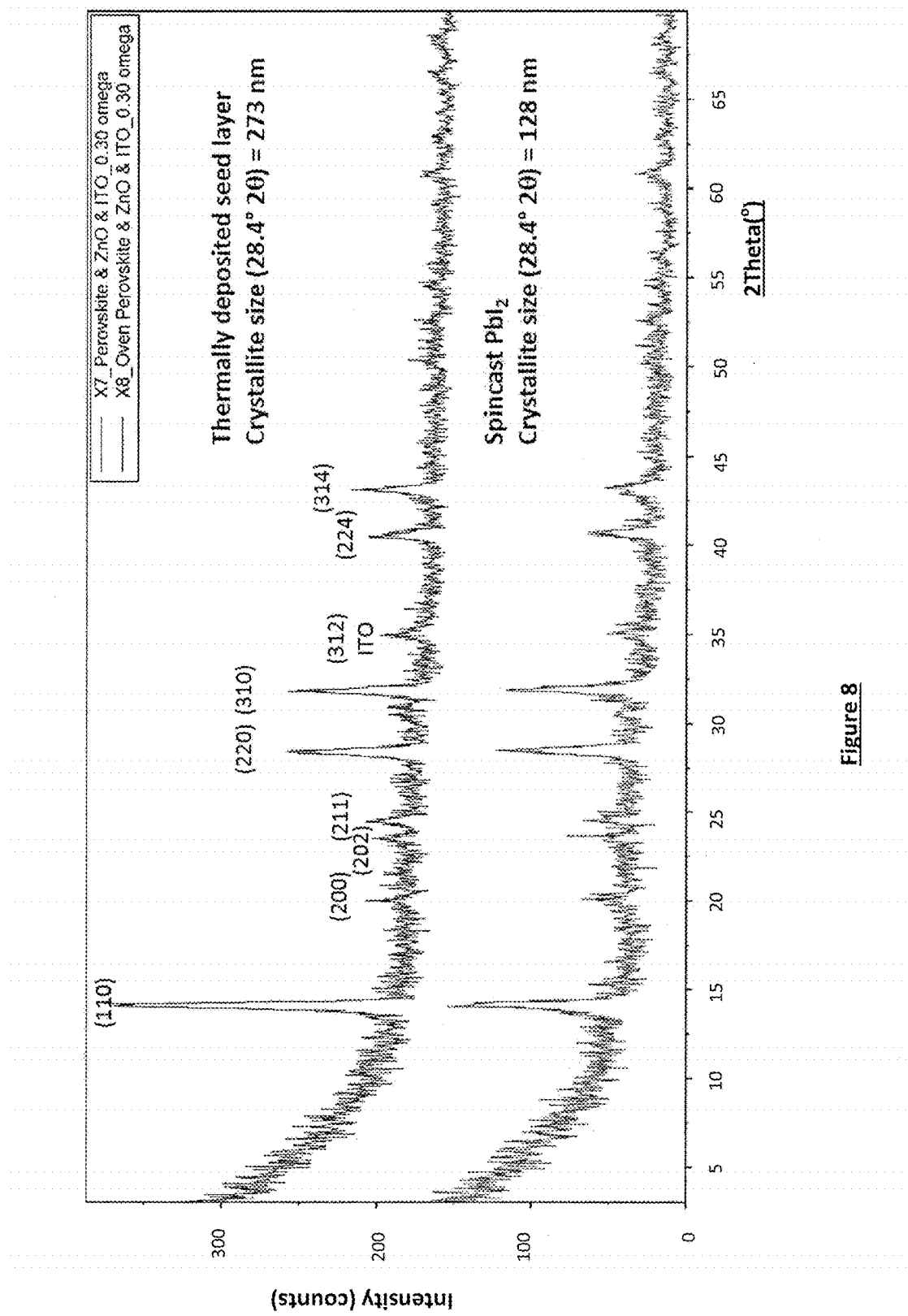
FIG. 8 provides XRD analysis of the evaporated Pb seed layer, converted to the active $CH_3NH_3PbI_3$ material.

FIG. 8 provides an XRD analysis of the evaporated Pb seed layer, converted to the active $CH_3NH_3PbI_3$ material. Grazing incidence X-ray diffraction (FIG. 8) of deposited thin films demonstrates the preparation of the desired perovskite photoactive $CH_3NH_3PbI_3$ material. Two methods can be used for the conversion of $PbI_2$ to perovskite: (1) vapour deposition/intercalation of $CH_3NH_3I$ into $PbI_2$ film. (2) spin-coating and thermal annealing of a $CH_3NH_3I$ material in anhydrous isopropanol. The crystallite size was determined using a calibration of a Si standard to be (1) 273 nm and (2) 128 nm based on the 28.4 degrees 2-theta diffraction peak.

Figure 9:
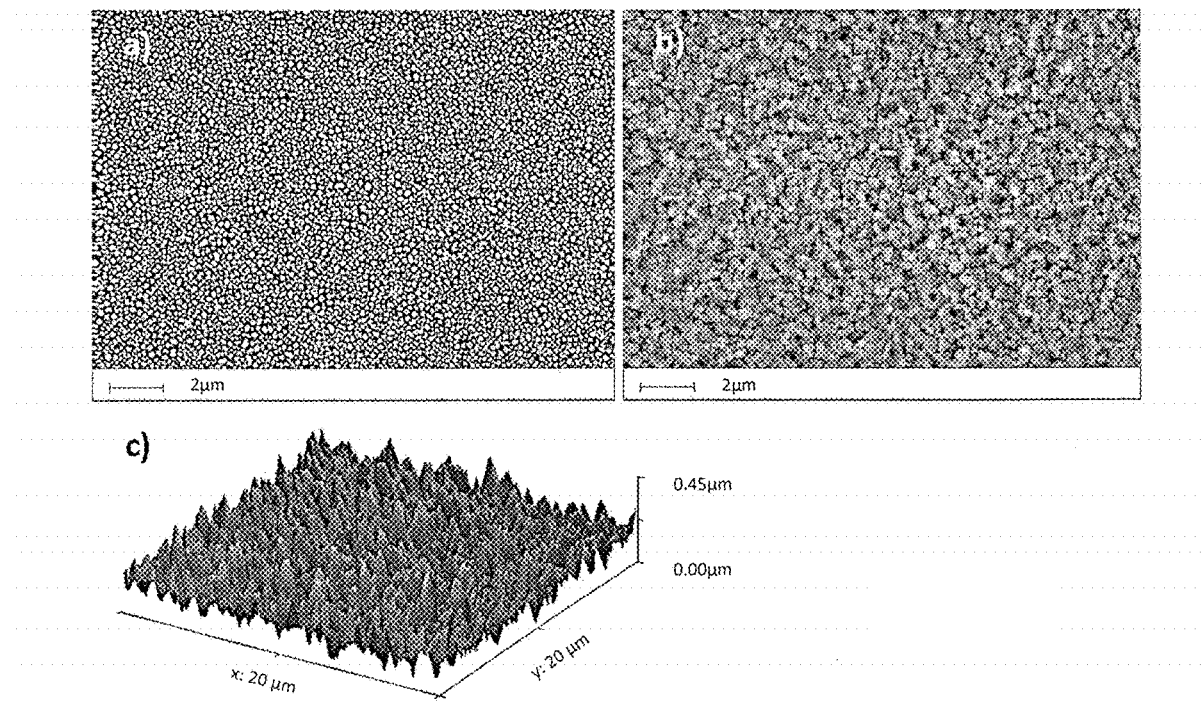
FIG. 9 shows (a) SEM image of $PbCl_2$ formed by the Pb seed layer (b) SEM image of subsequent formed $CH_3NH_3PbI_3$, and c) surface topology AFM of $PbCl_2$ following conversion.

FIG. 9 provides SEM images of (a) PbCl$_2$ formed by the Pb seed layer (b) subsequent CH$_3$NH$_3$PbI$_3$, and (c) surface topology AFM of PbCl$_2$ following conversion. The regularity of the Pb seed layer is evident in the conversion to PbCl$_2$. SEM of PbCl$_2$ layer (FIG. 9a) reveals sub-100 nm crystallites which are readily converted to the active CH$_3$NH$_3$PbI$_3$ (FIG. 9b) with larger domain sizes which provide fewer grain boundaries in the final device. The surface topology was investigated using atomic force microscopy mapping of the solar cell layers, depicted in FIG. 9c. The analysis reveals the evaporated Pb seed layer and subsequent PbI$_2$ layer to be highly planar and smooth (12.8 and 28.3 nm roughness RMS, respectively).

2.2.5 Photovoltaic Cell Fabrication.

In a glovebox atmosphere, a solution of 20 mg/mL P3HT polymer hole transport material in chlorobenzene was spun cast atop the perovskite film at 2000 rpm. The contacts were cleaned, before evaporation of a 80 nm thick layer of Ag as the cathode.

2.2.6 Performance

Figure 10:
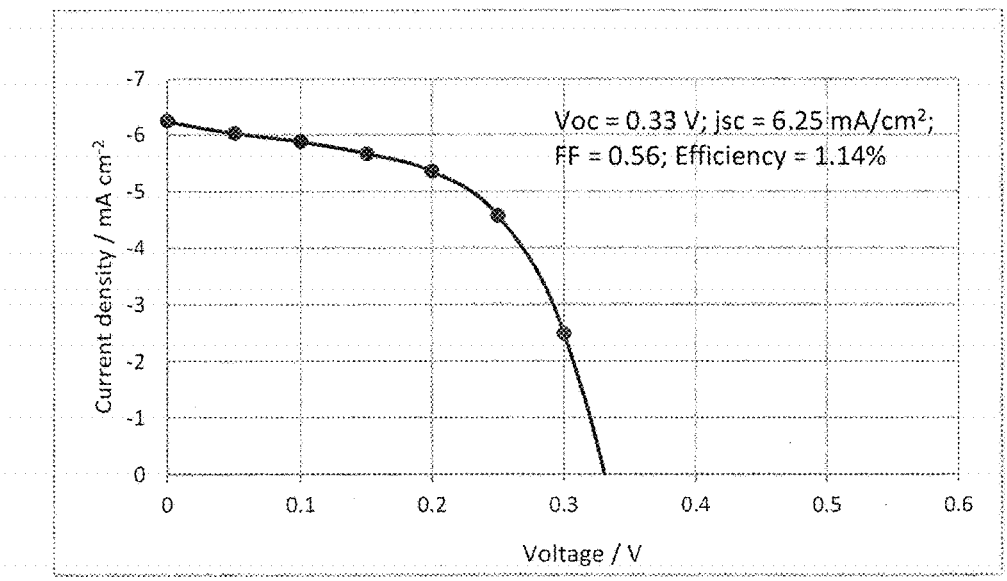
FIG. 10 provides an I-V curve of the evaporated Pb on $TiO_2$IFTO embodiment.
Figure 11A:
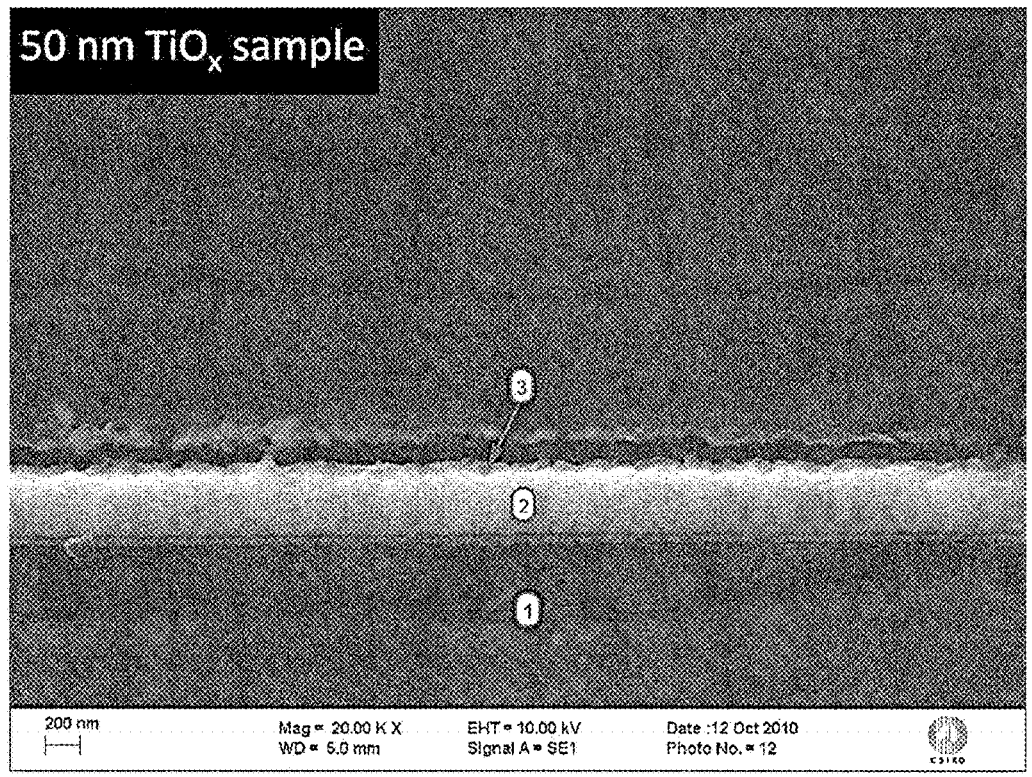
FIG. 11 shows cross-section SEM depicting the thin-layer of TiOx deposited on the surface of FTO glass.
Figure 11B:
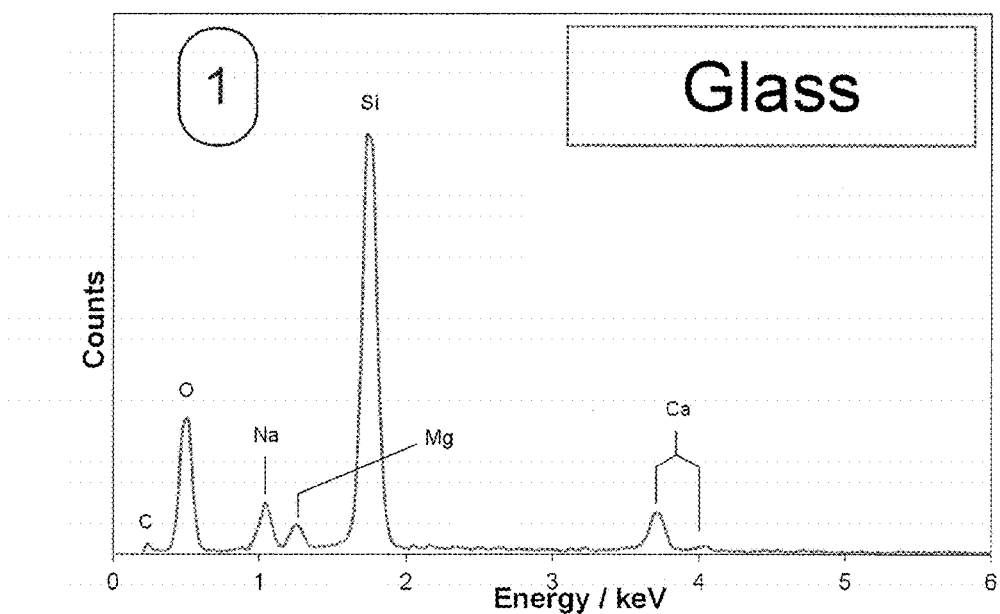
Figure 11C:
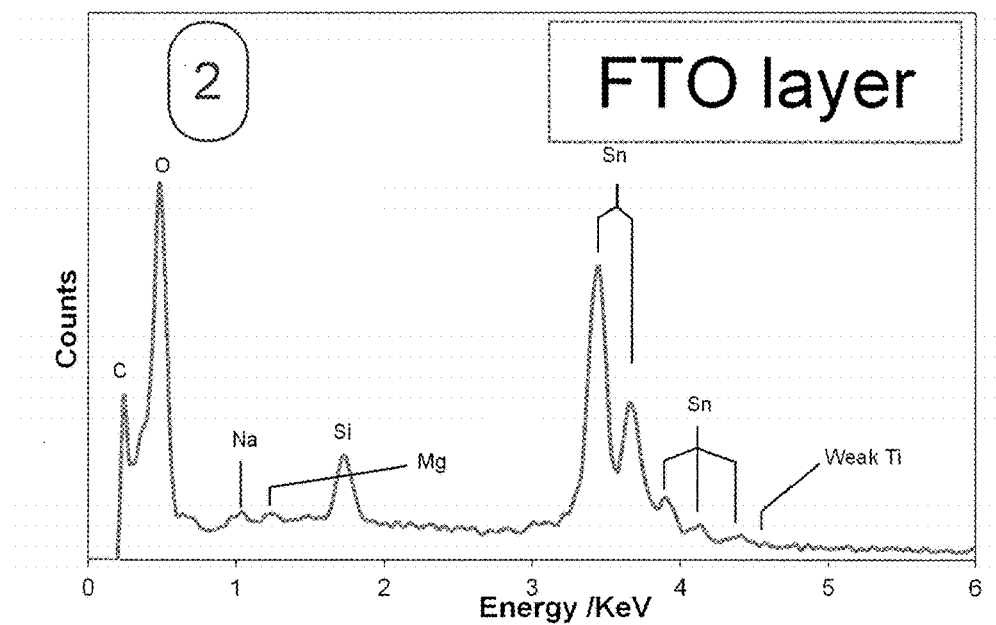
Figure 11D:
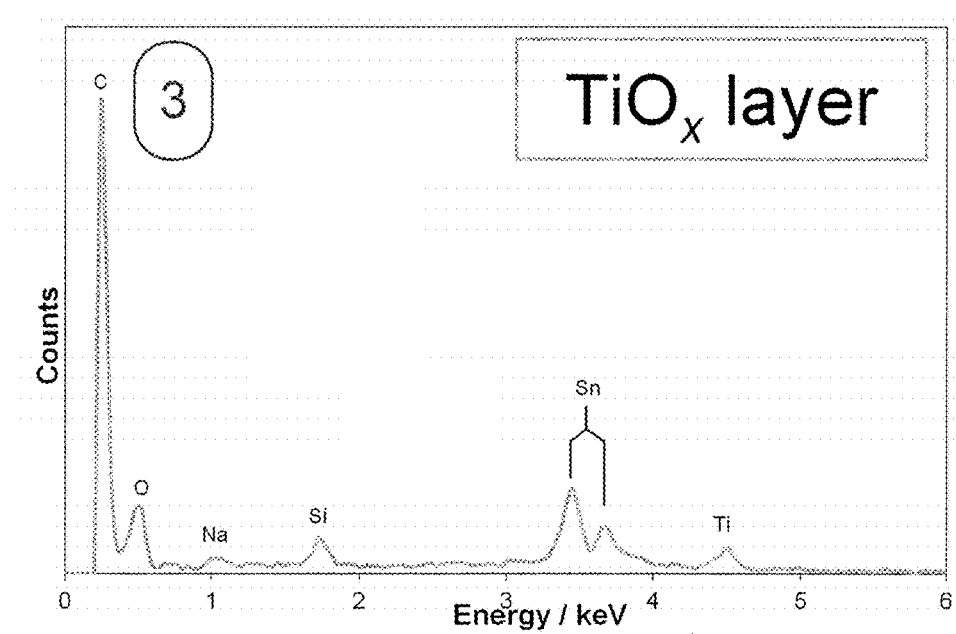

FIG. 10 provides the I-V curve of the evaporated Pb on TiO$_2$/FTO embodiment.

Example 3—Embodiment of TiO$_x$ Blocking Layer Formation

A device was produced following the method outlined in Example 1. However, in this example prior to a thin metallic Pb seed layer being electrochemically deposited onto the substrate, the substrate requires a thin-layer to reduce electrical recombination and hence a 'blocking layer' is deposited prior to deposition of the Pb seed layer. For large area embodiments, typical spray-cast or screen-printed TiO$_2$ thin-films can be replaced by the use of an evaporated thin-film of Ti, introduced under an oxidising environment using DC magnetron sputtering. This results in a controlled thickness of film of semi-amorphous TiO$_x$.

A cross-section SEM depicting the thin-layer of TiO$_x$ deposited on the surface of FTO glass by sputtering is shown in FIG. 11. This SEM topographic images shows that the deposition of TiOx results in a uniform coating on FTO. The series of coating thickness are shown in FIG. 12 which confirms a thin-film results that conforms to the underlying substrate morphology.

Example 4—Embodiment of Evaporated Pb Seed Layer

In the following example, a thin metallic Pb seed layer was formed by thermal evaporation of Pb and condensation onto an n-type compact blocking layer (in this example either ZnO or TiO$_2$) as a precursor for a perovskite solar cell. The seed layer once deposited is then chemically converted using I$_2$ vapour treatment and subsequent exposure to CH$_3$NH$_3$I vapour in a 2-step treatment to form a photoactive perovskite material following the same method outline in Example 2.

Figure 13:
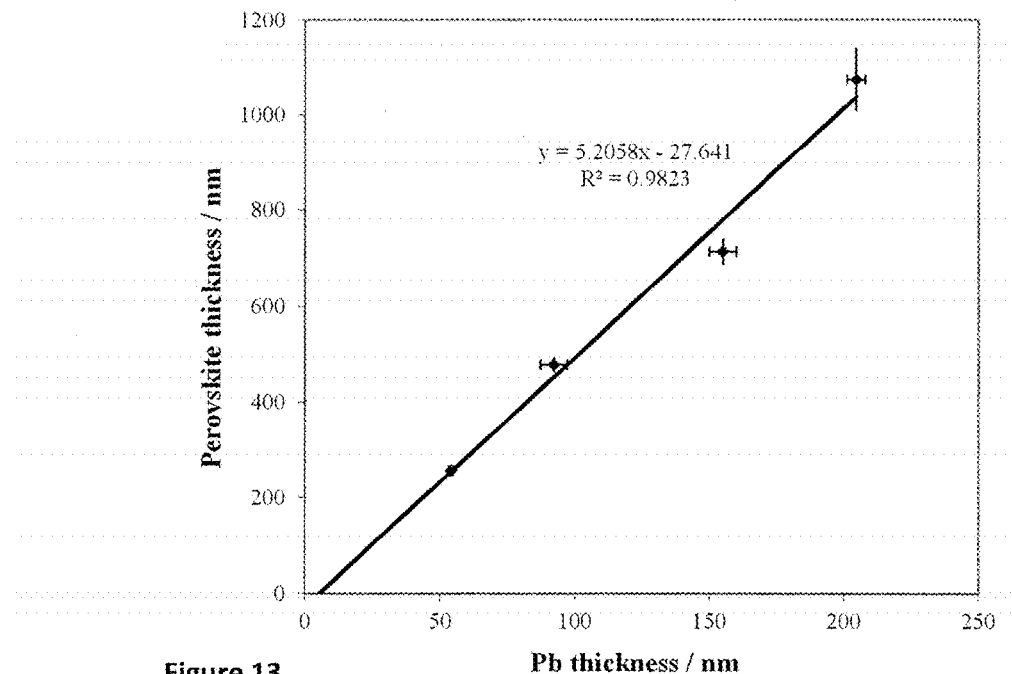
FIG. 13 depicts a calibration plot of evaporated Pb seed thickness against the final perovskite active film thickness as a function of deposited Pb thickness.

FIG. 13 depicts a calibration plot of evaporated Pb seed thickness against the final perovskite active film thickness as a function of deposited Pb thickness.

Figure 14:
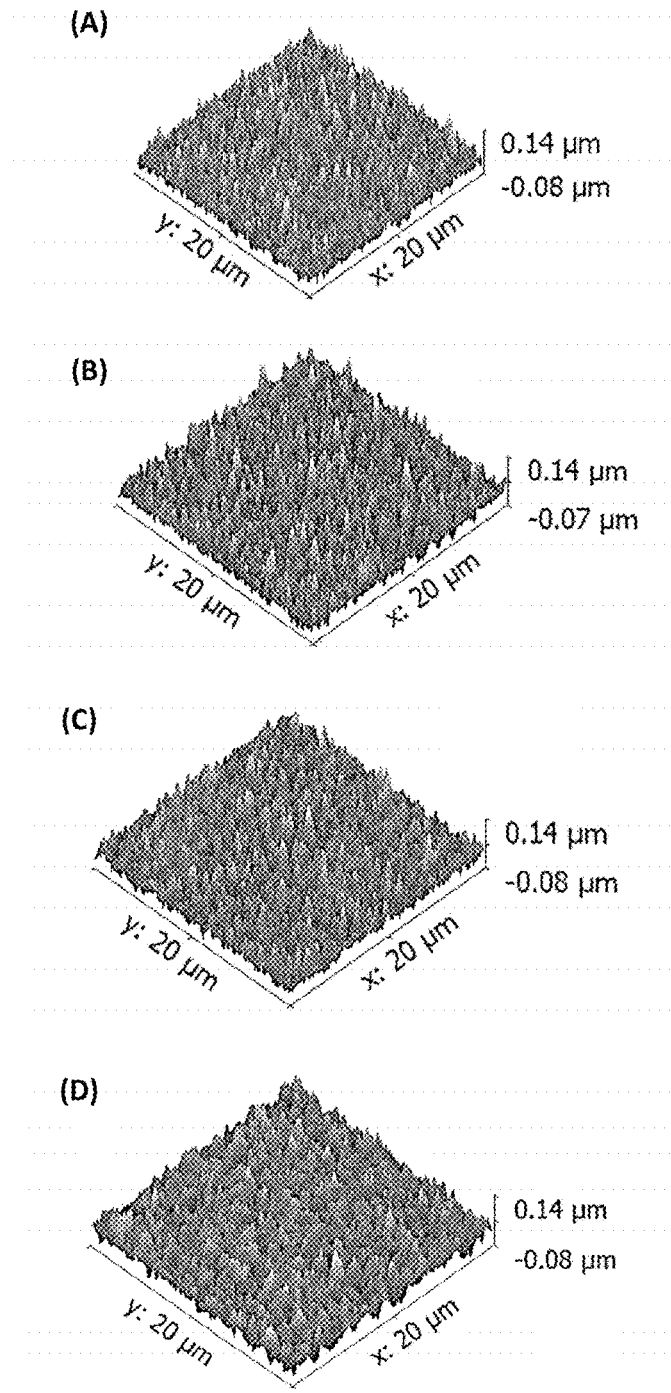
FIG. 14 shows an AFM topography of the layers of a perovskite active film formed from the thermally-evaporated Pb seed layer.

FIG. 14 shows an AFM topography of the layers of a perovskite active film formed from the thermally-evaporated Pb seed layer. This demonstrates that the thin-film maintains the morphology of the FTO substrate from Pb seed layer, to PbI$_2$ and the final CH$_3$NH$_3$PbI$_3$, substantially matching the surface roughness of the substrate to which the layer is applied.

Surface roughness was determined on two different lateral scales: i) for regions <30 micron Atomic Force Microscopy (AFM) in scanning mode was used to scan an area equivalent to 20×20 micron using Root Mean Square (RMS) as the quantity of merit to represent standard deviation of surface height as a function of changes in spatial and/or temporal surface roughness; ii) Surface Profilometry was used for lengths >30 mm and up to 2 mm by drawing a stylus across the surface in 'hills and valleys' mode and a planar region of the scan, no less than 500 mm, allowed the determination of the maximum and minimum of surface features where the range from maximum to minimum defines the surface barrier height, for these purposes. It should be noted that the minimum and maximum is measured relative to a baseline of the stylus.

In FIG. 14, the following properties apply to the AFM topography:

TABLE 1

Sample properties for AFM shown in FIG. 14

| Sample | Properties |
|---|---|
| A | Bare FTO<br>RMS roughness = 27.1 nm |
| B | Pb thermally evaporated on FTO<br>RMS roughness = 23.9 nm |
| C | PbI$_2$ made from Pb thermally evaporated on FTO<br>Converted to PbI$_2$ with I$_2$ vapour<br>RMS roughness = 24.0 nm |
| D | CH$_3$NH$_3$PbI$_3$ Perovskite from thermally evaporated Pb seed on FTO<br>PbI$_2$ formed with I$_2$ vapour<br>Perovskite formed from PbI$_2$ with CH$_3$NH$_3$I vapour<br>RMS roughness = 24.9 nm |

Table 1 and FIG. 9 indicate that the surface roughness of the intermediate is lower than the surface roughness of the substrate. This difference is preferably at least 2 nm and more preferably at least 3 nm. It should be appreciated that the roughness parameters in Table 1 are Root Mean Squared Surface Roughness $R_{RMS}$ values. The Root Mean Square of surface roughness represents the standard deviation of surface heights and is used to compare spatial and temporal changes in a surface.

Figure 15:
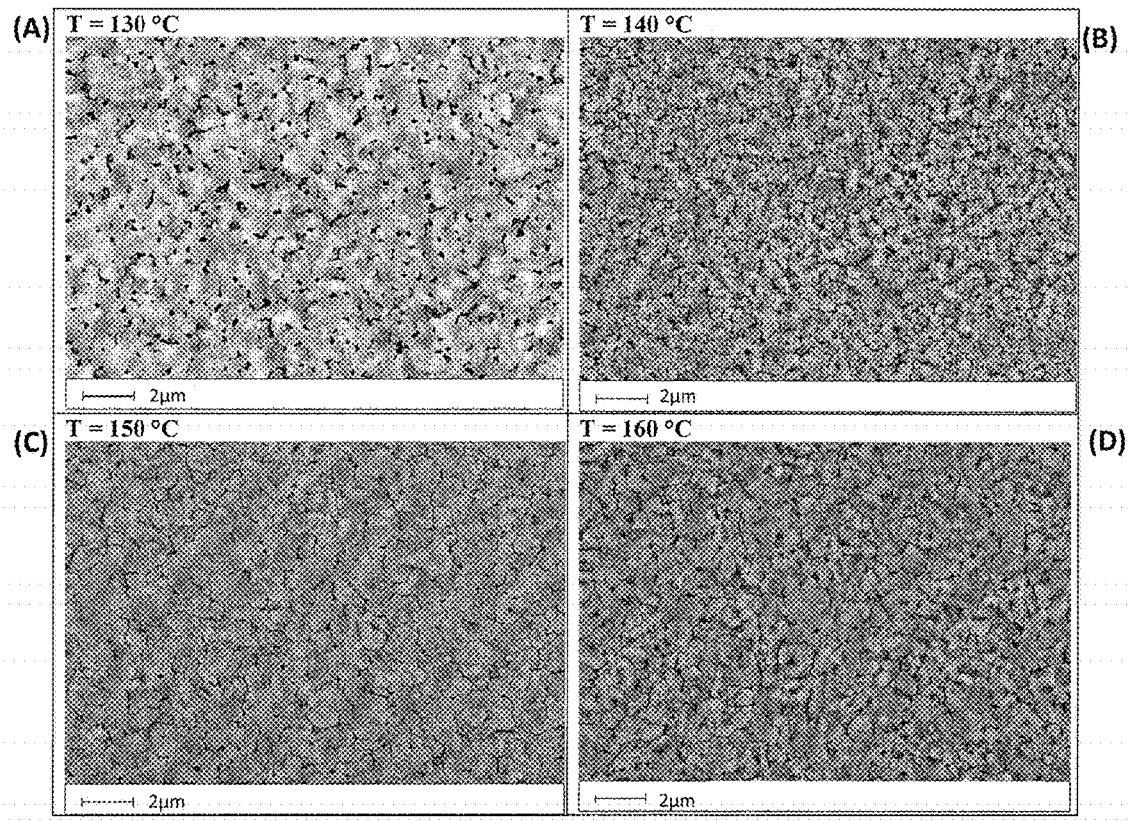
FIGS. 15(a) to (d) show SEM of Perovskite grains after direct conversion of Pb films to $CH_3NH_3PbI_3$ via vapour treatment with $CH_3NH_3I$ vapour under 200 mBar vacuum at the indicated temperatures.

FIG. 15 provides a series of SEM images that depict the direct conversion of the Pb seed film through the introduction of CH$_3$NH$_3$I (MEAI) in the presence of atmospheric O$_2$ in trace amounts in a sealed chamber. This series of SEM images demonstrates that conversion to the active perovskite film morphology can be activated and controlled through variation of temperature of furnace. It should be noted that the black specks in the images are a result of sputtering conductive coating (Au) to stablise sample for analysis.

Figure 16:
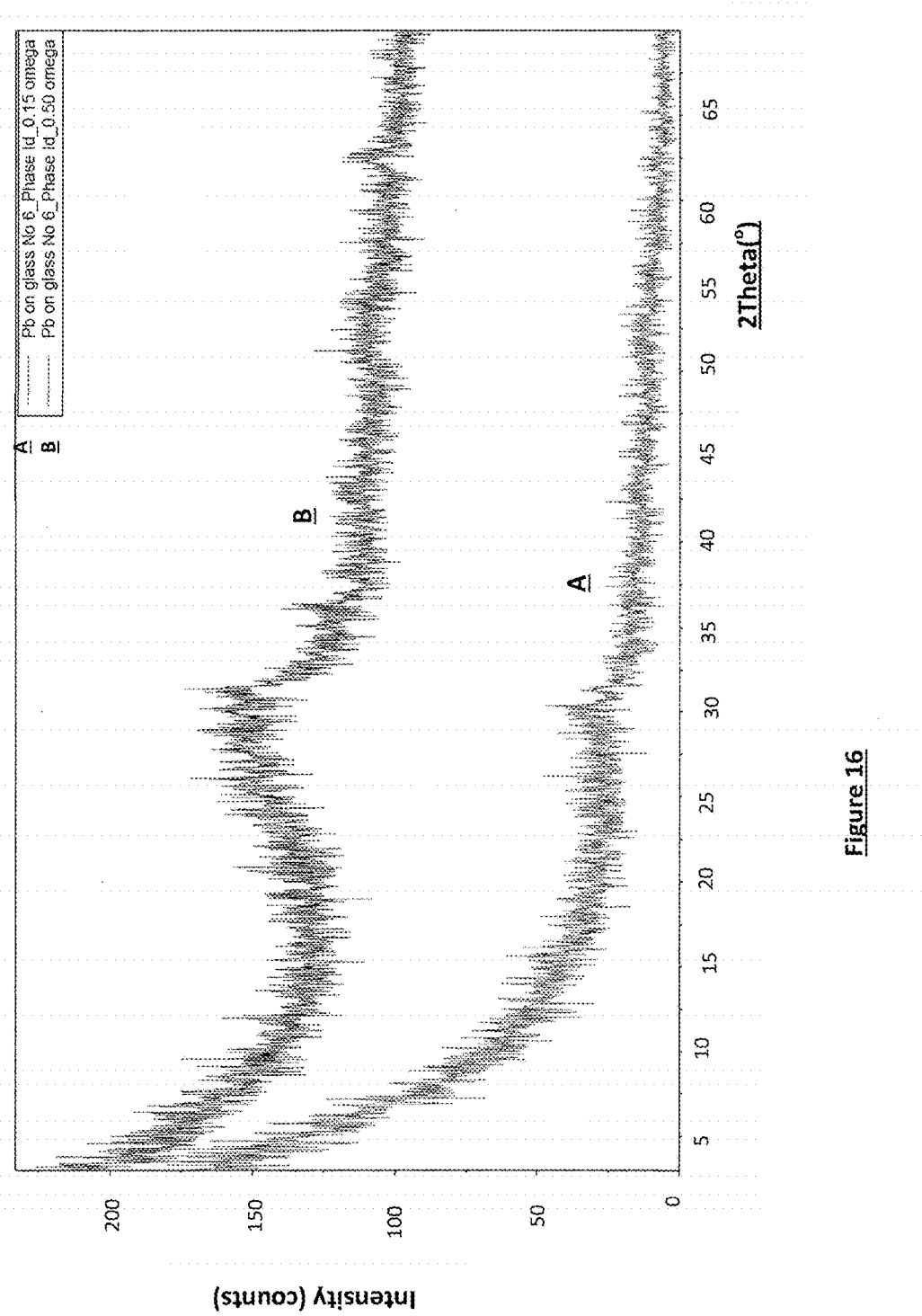
FIG. 16—XRD pattern of thermally-evaporated Pb film.

Using different depths of grazing angle to examine the surface film formed in this example in the absence of the underlying substrate (FTO on glass), XRD pattern of thermally-evaporated Pb film indicates that the seed deposit is amorphous as shown in FIG. 16.

Figure 17:
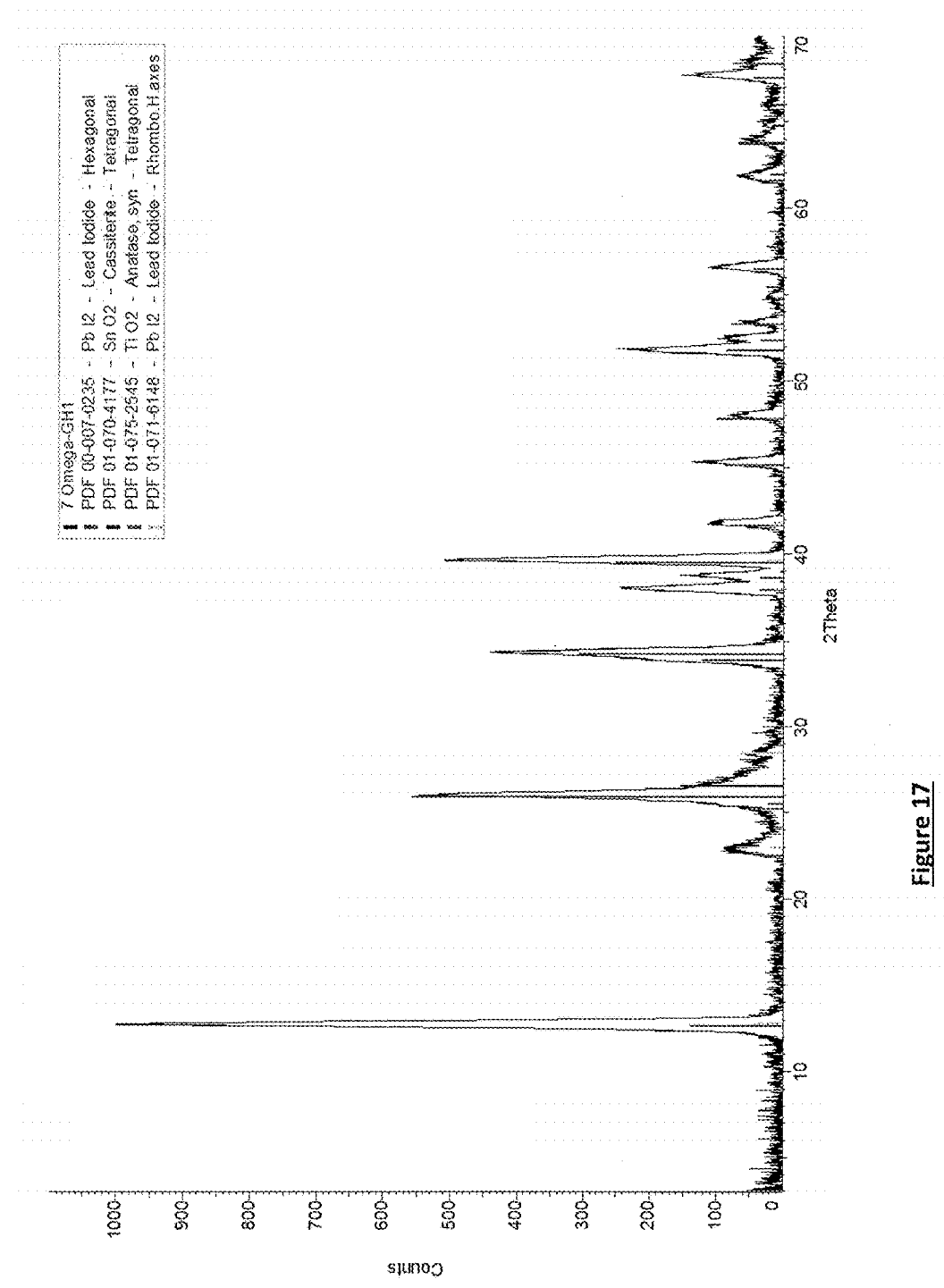
FIG. 17 provides a typical XRD pattern of a $PbI_2$ film formed via vapour treatment of a thermally-evaporated Pb film with $I_2$ vapour FIG. 18A provides an XRD pattern of final perovskite films, (a) formed from thermally-evaporated Pb converted to perovskite via vapour treatment with subsequent $I_2$ and $CH_3NH_3I$ vapour treatments, (b) pattern of a typical spin-coated perovskite sample.

FIG. 17 provides a Typical XRD pattern of a PbI$_2$ film formed via vapour treatment of a thermally-evaporated Pb film with I$_2$ vapour (as formed in this example) representing complete conversion of the Pb to the intermediate PbI$_2$ film.

Figure 18A:
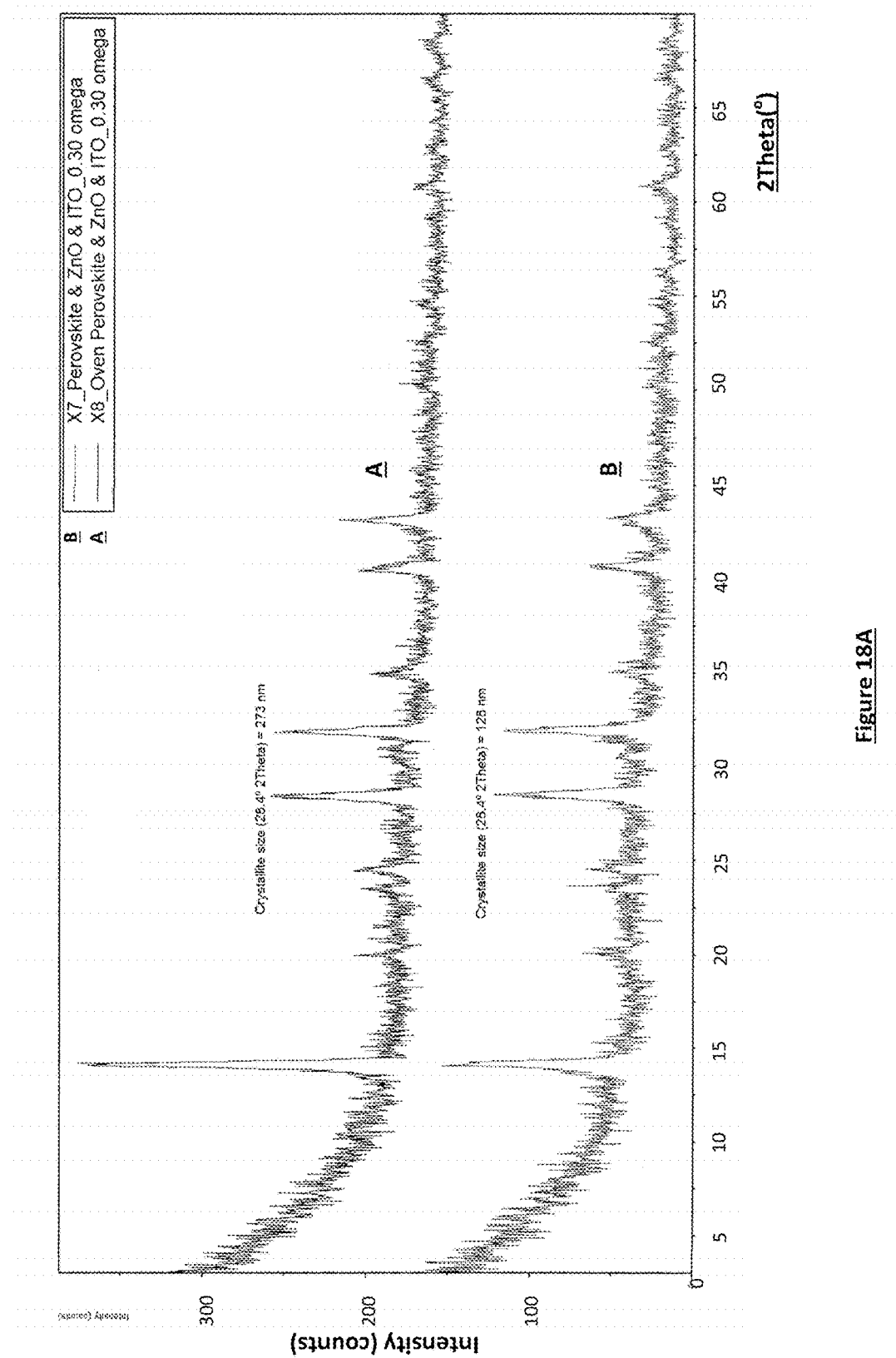
FIG. 18B represents surface profilimetry data depicting the relative difference in surface uniformity for (a) FTO glass as a substrate; (b) solution derived spin-cast $PbI_2$ film; and (c) $PbI_2$ made from Pb thermally evaporated on FTO converted to $PbI_2$ with $I_2$ vapour.

FIG. 18A provides an XRD pattern of final perovskite films, (a) formed from thermally-evaporated Pb converted to perovskite via vapour treatment with subsequent I$_2$ and CH$_3$NH$_3$I vapour treatments, (b) pattern of a typical spin-coated perovskite sample. The crystallite size from the Scherrer equation gives 273 nm for our method vs 128 nm for the spin-coated sample. Instrument broadening was calibrated with a Si standard.

Figure 18B:
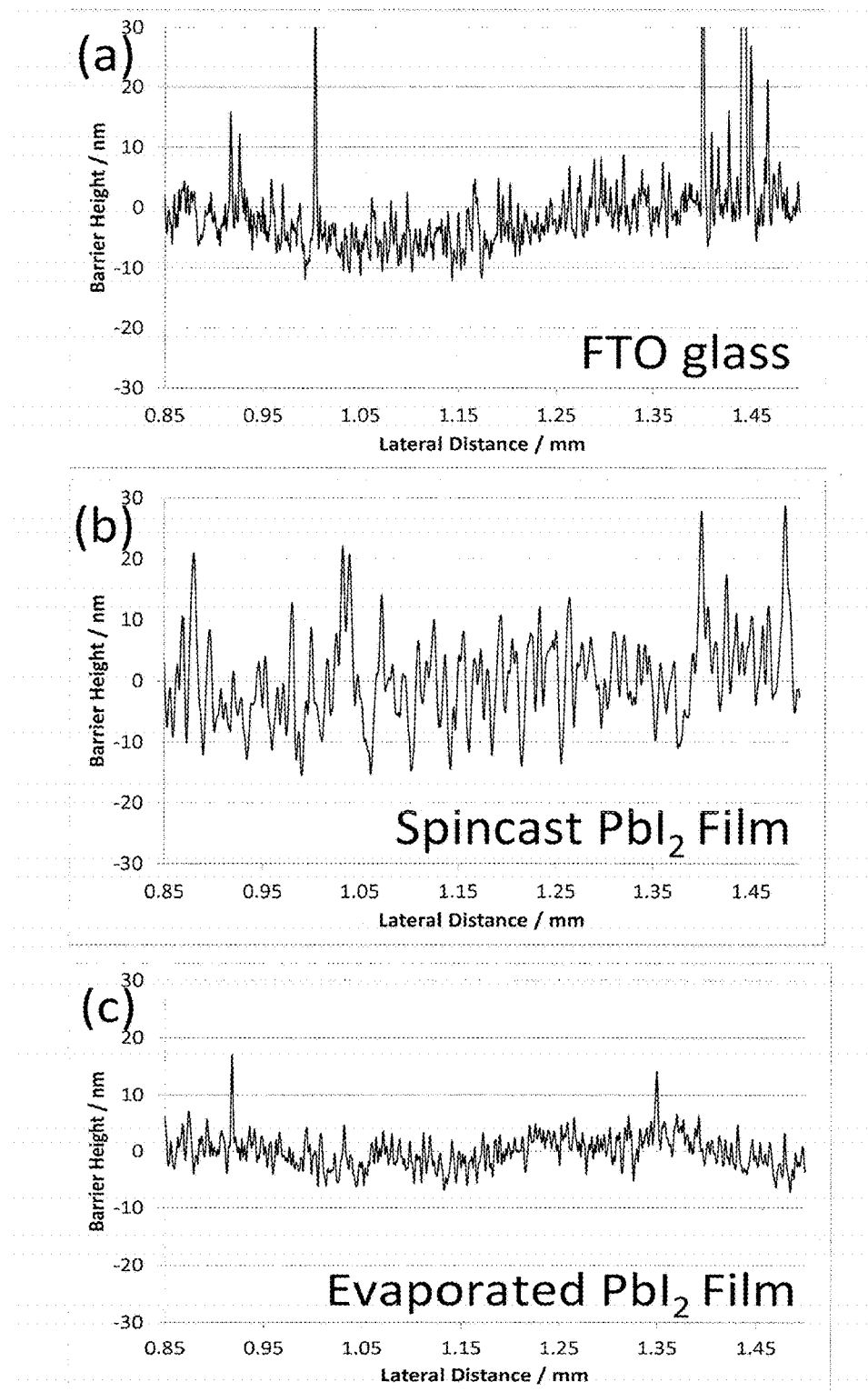

FIG. 18B represents surface profilimetry data depicting the relative difference in surface uniformity for (a) FTO glass as a substrate; (b) solution derived spin-cast $PbI_2$ film; and (c) $PbI_2$ made from Pb thermally evaporated on FTO converted to $PbI_2$ with $I_2$ vapour. As detailed above, Surface Profilometry is used to determine surface roughness (RMS roughness) for lengths >30 mm and up to 2 mm by drawing a stylus across the surface in 'hills and valleys' mode and a planar region of the scan, no less than 500 mm, allowed the determination of the maximum and minimum of surface features where the range from maximum to minimum defines the surface barrier height, for these purposes. For FIG. 18B, the films were examined for 'hills and valleys' over a distance of 600 μm where (a) gave a minimum −11.97 nm/maximum 182.8 nm and a barrier height of 194.8 nm; (b) gave a minimum −15.48 nm/maximum 28.74 nm and a barrier height of 44.22 nm; (c) gave a minimum −8.12 nm/maximum 28.87 nm and a barrier height of 36.99 nm representing an approx. 20% improvement in surface roughness for this process over conventional solution derived spin cast/coating deposition methods. It is further noted that the minimum or valleys of the three samples provide (a) the original substrate (−11.97 nm); (b) cast spun increasing to −15.48 nm; and (c) the thermal evaporation of Pb coating decreases to −8.12 nm. Thus, for the thermal evaporation of Pb coating, the decrease in minimum (valley) depth provides an indication of improvement on surface roughness (decrease) as the coating process fills these regions, improving the surface topography and thus roughness compared to the original substrate. In contrast, the cast coating resulted in increased roughness compared to the original substrate.

Figure 19:
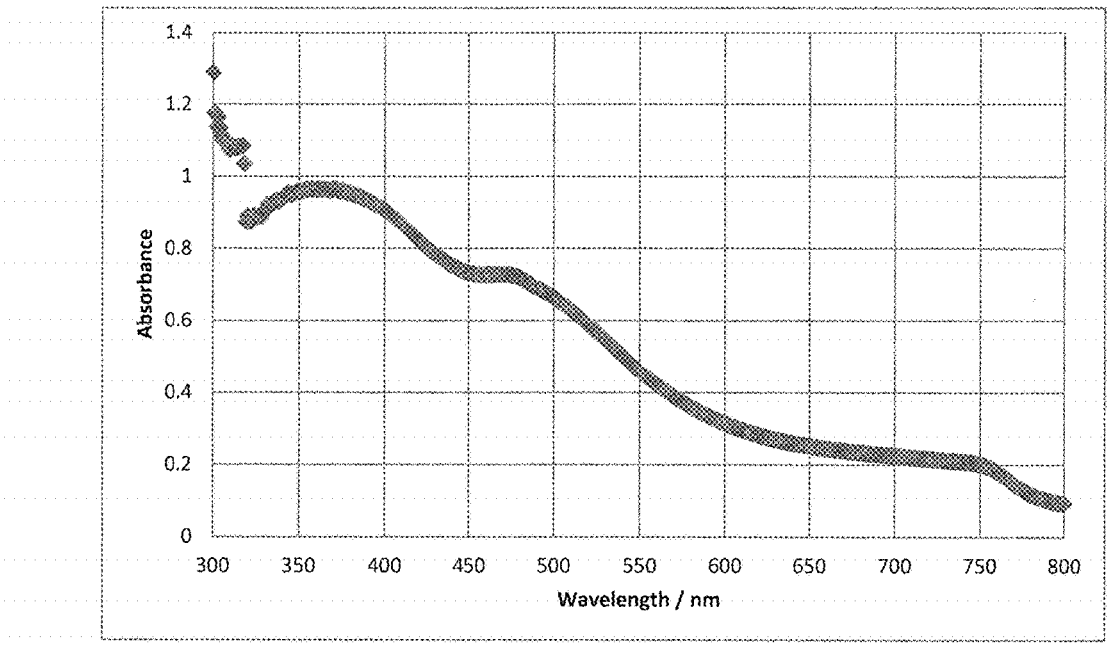
FIG. 19 provides a plot of the Typical UV visible spectrum of a perovskite film formed from a 75 nm Pb seed layer.
Figure 20:
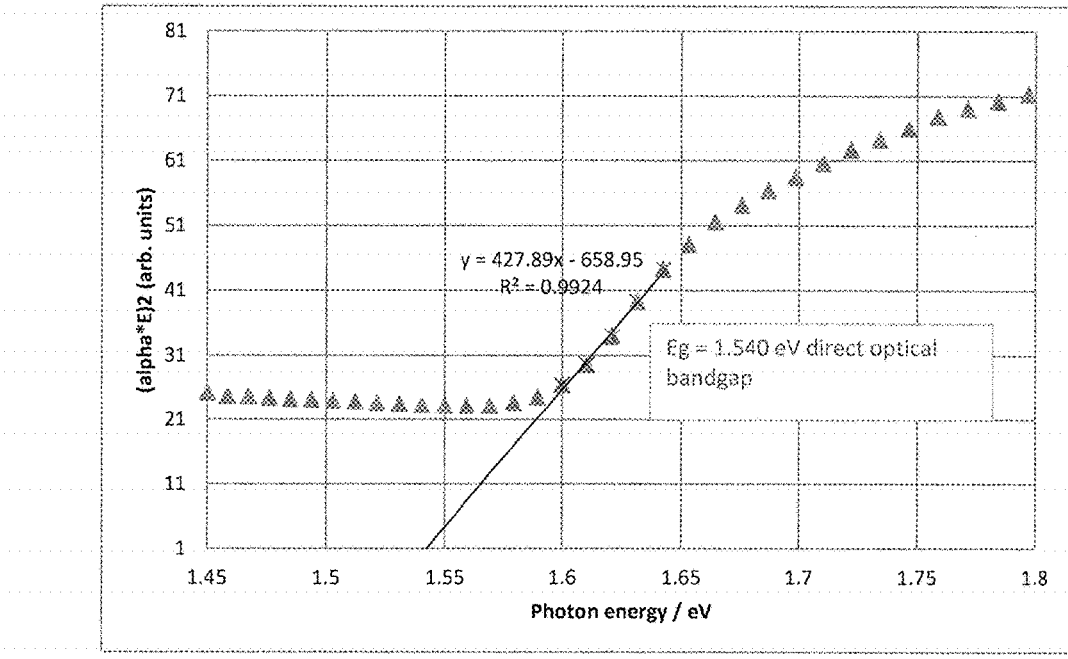
FIG. 20 provides a Typical Tauc plot from UV-visible reflectance data illustrating the 1.54 eV bandgap of final perovskite active layer from a thermally evaporated Pb seed layer.

FIG. 19 provides a plot of the typical UV visible spectrum of a perovskite film formed from a 75 nm Pb seed layer. Similarly, FIG. 20 provides a Typical Tauc plot from UV-visible reflectance data illustrating the 1.54 eV bandgap of final perovskite active layer from a thermally evaporated Pb seed layer.

Figure 21A:
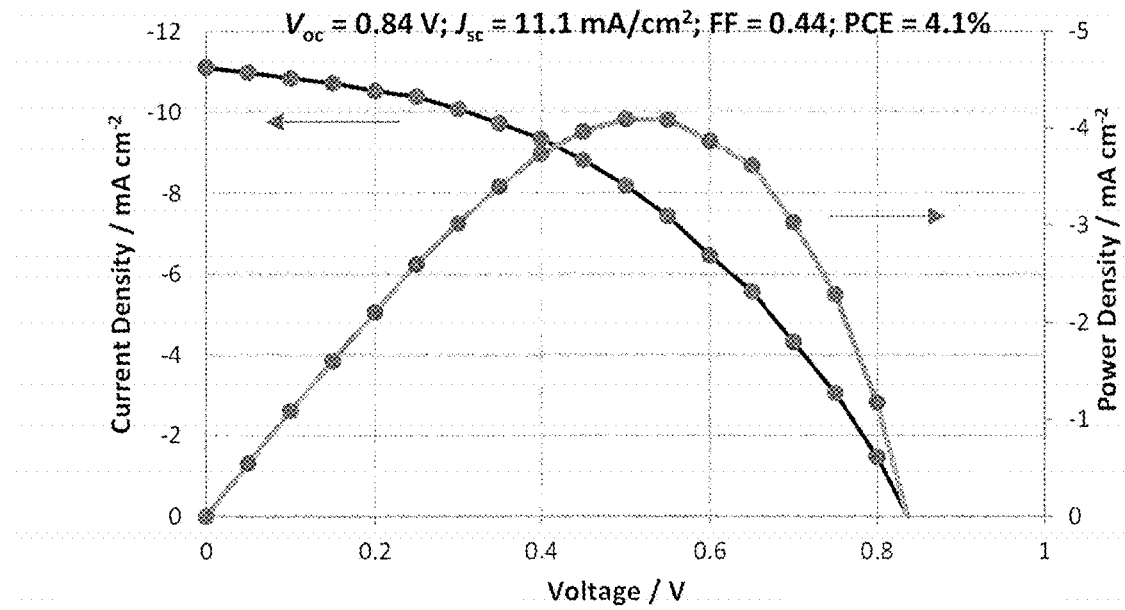
Figure 21B:
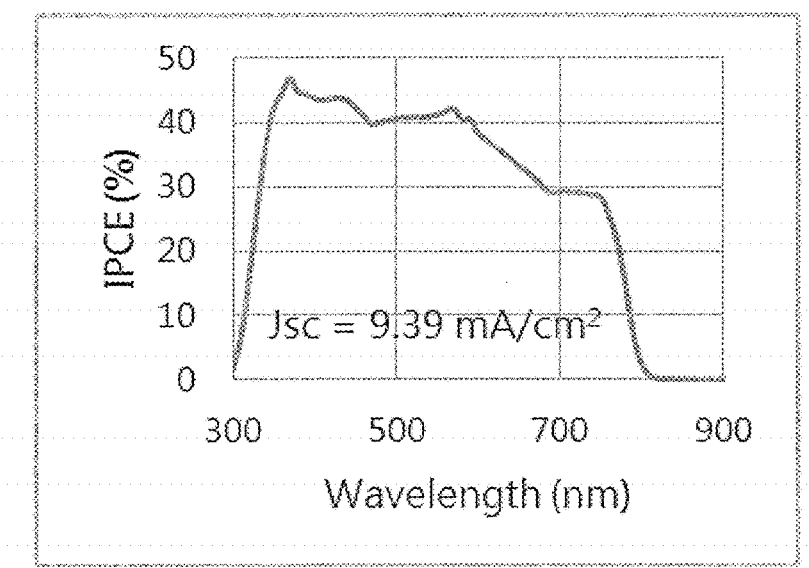

FIG. 21(A) and FIG. 21(B) provide an example of operating device from evaporated Pb layer: (left) current-voltage response; (right) incident photon to current efficiency. $PbI_2$ formed by vapour treatment with $I_2$. $CH_3NH_3PbI_3$ formed by interdiffusion with $CH_3NH_3I$ in isopropanol and subsequent annealing.

Example 5—Embodiment of Evaporated Pb Seed Layer

In the following example, a thin metallic Pb seed layer was again formed by thermal evaporation of Pb and condensation onto an n-type compact blocking layer (in this example either ZnO or $TiO_2$) as a precursor for a perovskite solar cell. The seed layer once deposited is then chemically converted using $I_2$ vapour treatment and subsequent exposure to $CH_3NH_3I$ vapour in a 2-step treatment to form a photoactive perovskite material following the same method outline in Example 2.

Figure 22:
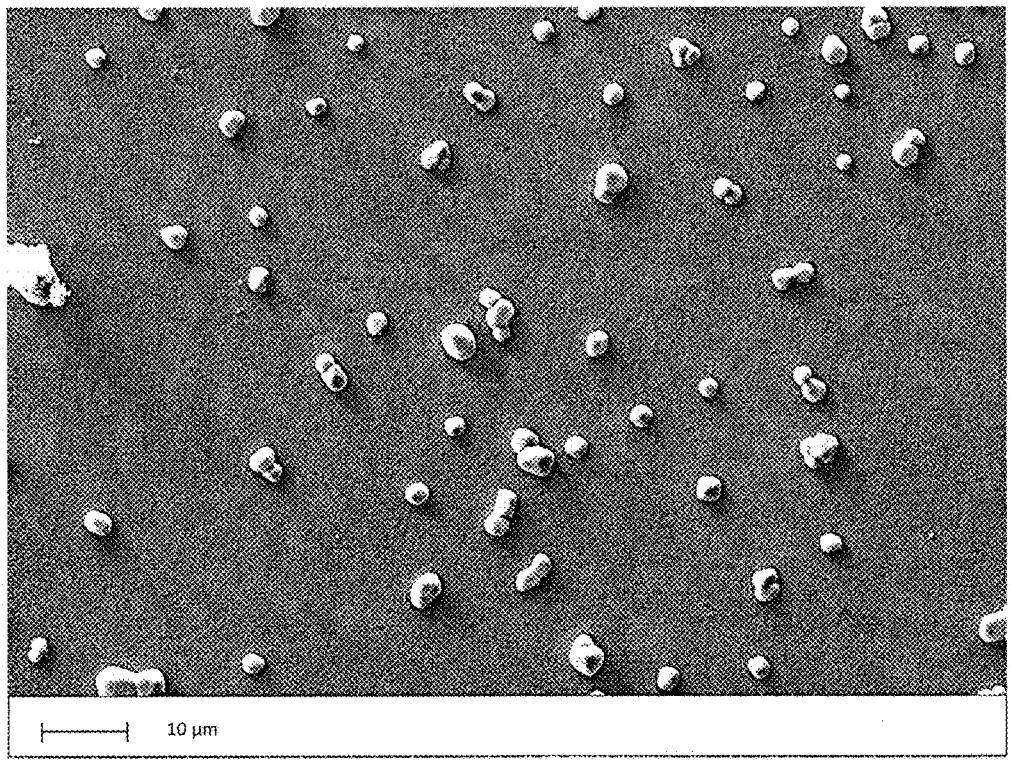
FIG. 22 shows a Pb film deposited on $TiO_2$IFTO substrate at −1.0 V vs Ag/AgCl for 30 s. The electrolyte was 10 mM $Pb(NO_3)_2$+0.1 M $NH_4NO_3$ supporting electrolyte.

FIG. 22 shows a Pb film deposited on $TiO_2$/FTO substrate at −1.0 V vs Ag/AgCl for 30 s. The electrolyte was 10 mM $Pb(NO_3)_2$+0.1 M $NH_4NO_3$ supporting electrolyte.

Figure 23:
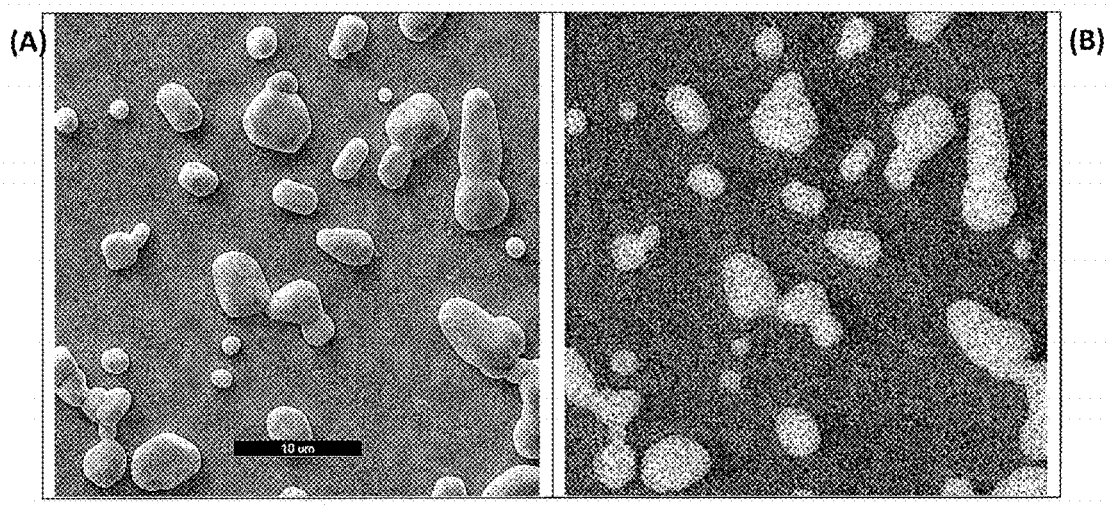
FIG. 23 shows (A) SEM morphology of a typical Pb deposit; (B) Energy-dispersive X-ray analysis of the deposit. Blue=Sn (from FTO conducting glass); Yellow=Pb (deposits).

FIG. 23 shows (A) SEM morphology of a typical Pb deposit; (B) Energy-dispersive X-ray analysis of the deposit. Blue=Sn (from FTO conducting glass); Yellow=Pb (deposits).

Figure 24:
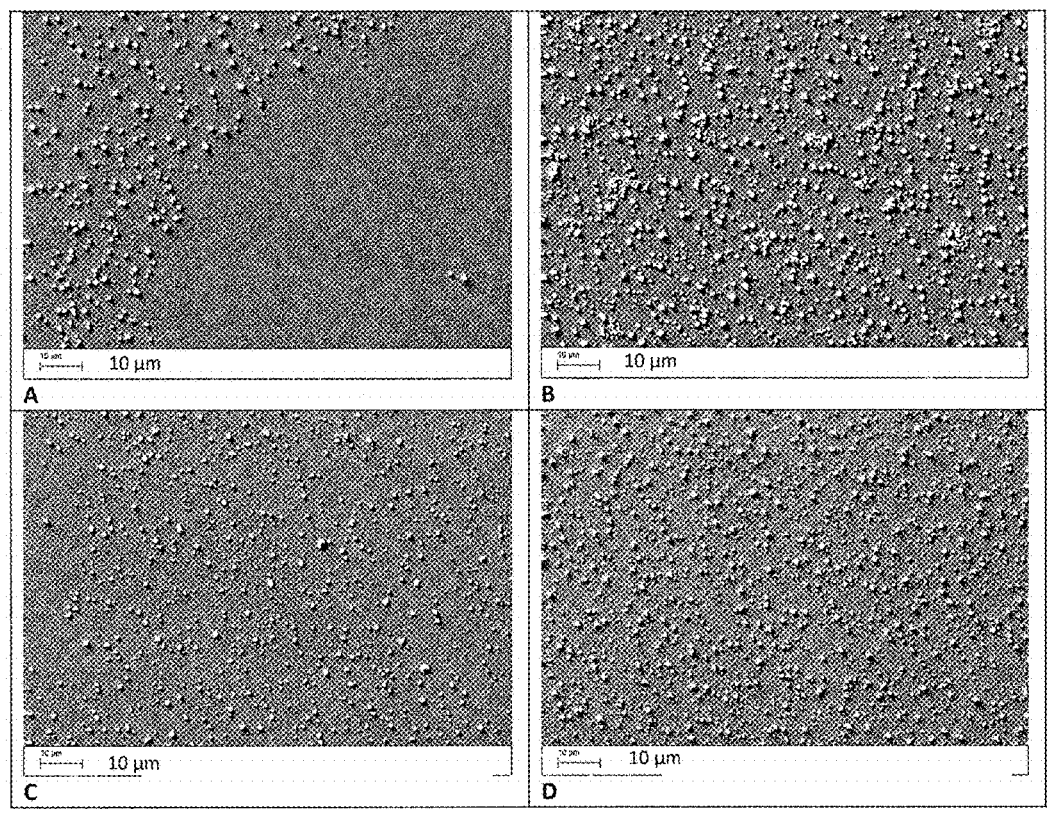
FIG. 24 provides Examples of control of electrodeposition process on final Pb seed layer, in which A is 10 seconds at 0.6V, B is 30 seconds at 0.6 V, C is 10 seconds at 0.7 V, D is 30 seconds at 0.7 V.

Finally, FIG. 24 provides examples of control of electrodeposition process on final Pb seed layer, in which A is 10 seconds at 0.6V, B is 30 seconds at 0.6 V, C is 10 seconds at 0.7 V, D is 30 seconds at 0.7 V. Sample A image deliberately includes open space to depict the underlying FTO substrate.

Those skilled in the art will appreciate that the invention described herein is susceptible to variations and modifications other than those specifically described. It is understood that the invention includes all such variations and modifications which fall within the spirit and scope of the present invention.

Where the terms "comprise", "comprises", "comprised" or "comprising" are used in this specification (including the claims) they are to be interpreted as specifying the presence of the stated features, integers, steps or components, but not precluding the presence of one or more other feature, integer, step, component or group thereof.

Clauses

The clauses defining the breath and scope of the present invention are as follows:

C1. A process of forming a thin film photoactive layer of an optoelectronic device comprising:
providing a substrate having a surface comprising or coated with a metal M selected from at least one of Pb, Sn, Ge, Si, Ti, Bi, or In; and
converting the metal surface or metal coating of the substrate to a perovskite layer.

C2. A process according to clause 1, wherein the substrate is coated with a metal M prior to the converting step by:
applying at least one coating of a metal M selected from at least one of Pb, Sn, Ge, Si, Ti, Bi, or In to a substrate to form a coated substrate.

C3. A process according to clause 2, wherein the at least one coating of a metal M is applied to the substrate by a deposition method.

C4. A process according to clause 3, wherein the deposition method includes at least one of electrodeposition, electrophoretic deposition, electroplating, or electroless deposition.

C5. A process according to clause 2, wherein the at least one coating of a metal M is applied to the substrate by a physical coating method.

C6. A process according to clause 5, wherein the physical coating method includes at least one of sputter, cold spray; or application of solid film or layer to the substrate.

C7. A process according to clause 2 and 5, wherein the at least one coating of a metal M is applied to the substrate by an evaporative coating method.

C8. A process according to any one of clauses 5 or 7, wherein the metal layer is formed with a metal deposition rate on the substrate of between 0.1 and 2 Angstrom/second, preferably between 0.5 and 1.0 Angstrom/second.

C9. A process according to clause 8, wherein the deposition time is between 5 and 30 mins, preferably between 10 and 20 mins.

C10. A process according to any one of clauses 2 to 7, wherein the metal layer on the coating substrate is between 25 and 200 nm.

C11. A process according to any preceding clause, wherein the converting step comprises:
applying at least one perovskite precursor to the metal coating of the coated substrate to form the perovskite layer.

C12. A process according to any one of clauses 1 to 10, wherein the converting step comprises:
contacting the at least one coating of the metal coated substrate with a vapour X selected from a halide vapour comprising at least one of F, Cl, Br or I, or acetic acid vapour to form a metal compound $MX_2$ coating on the coated substrate; and thereafter applying at least one perovskite precursor to the coated substrate to form the perovskite layer.

C13. A process according to clause 12, wherein the halide vapour results from vapour from at least one of: halide containing solution; or halide solids.

C14. A process according to clause 12 or 13, wherein the at least one coating of the metal coated substrate is contacted with a vapour X at between 50 and 200° C., preferably between 75 and 150° C.

C15. A process according to clause 12, 13 or 14, wherein the at least one coating of the metal coated substrate is contacted with a vapour X in a reduced pressure, preferably in a vacuum.

C16. A process according to any one of clauses 11 to 15, wherein the at least one coating of the metal coated substrate is contacted with a vapour X in a bomb type reactor.

C17. A process according to any one of clauses 11 to 16, wherein the perovskite precursor comprises at least one perovskite precursor vapour.

C18. A process according to clause 17, wherein the converting step includes forming the perovskite layer by vapour deposition.

C19. A process according to clause 18, wherein the vapour deposition process comprises:

exposing the coated substrate to a perovskite precursor vapour comprising the perovskite precursor or one or more reactants for producing said perovskite precursor; and allowing deposition of the perovskite precursor vapour onto the metal halide $MX_2$ coating on the coated substrate, to produce a perovskite layer thereon.

C20. A process according to clause 18 or 19, wherein the vapour deposition is allowed to continue until the solid layer of perovskite has a thickness of from 100 nm to 100 μm, preferably from 100 nm to 700 nm.

C21. A process according to any one of clauses 11 to 20, wherein the perovskite precursor is a perovskite precursor solution comprising at least one perovskite precursor dissolved in a coating solvent.

C22. A process according to clause 21, wherein the coating solvent comprises an alcohol based solvent, preferably isopropanol.

C23. A process according any one of clauses 21 or 22, wherein the perovskite precursor is applied to the substrate using at least one of:

casting, doctor blading, screen printing, inkjet printing, pad printing, knife coating, meniscus coating, slot die coating, gravure coating, reverse gravure coating, kiss coating, micro-roll coating, curtain coating, slide coating, spin coating, spray coating, flexographic printing, offset printing, rotatory screen printing, or dip coating.

C24. A process according to any one of clauses 21 or 22, wherein the perovskite precursor is applied by dipping the coated substrate into the perovskite precursor solution.

C25. A process according to any one of clauses 11 to 24, wherein the perovskite precursor comprises at least one compound having the formula AX, or at least one reaction constituent for forming at least one compound having the formula AX, in which A comprises an ammonium group or other nitrogen containing organic cation and X is selected from at least one of F, Cl, Br or I.

C26. A process according to clause 25, wherein A in the perovskite precursor AX comprises an organic cation having the formula $(R_1R_2R_3R_4N)$, wherein:

$R_1$ is hydrogen, unsubstituted or substituted C1-C20 alkyl, or unsubstituted or substituted aryl;

$R_2$ is hydrogen, unsubstituted or substituted C1-C20 alkyl, or unsubstituted or substituted aryl;

$R_3$ is hydrogen, unsubstituted or substituted C1-C20 alkyl, or unsubstituted or substituted aryl; and $R_4$ is hydrogen, unsubstituted or substituted C1-C20 alkyl, or unsubstituted or substituted aryl.

C27. A process according to any one of clauses 25 or 26, wherein A in the perovskite precursor AX comprises an organic cation having the formula $(R_5R_6N=CH-NR_7R_8)$, and wherein:

$R_5$ is hydrogen, unsubstituted or substituted C1-C20 alkyl, or unsubstituted or substituted aryl;

$R_6$ is hydrogen, unsubstituted or substituted C1-C20 alkyl, or unsubstituted or substituted aryl;

$R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl.

C28. A process according to any one of clauses 25 to 27, wherein the perovskite precursor AX is selected from the group consisting of $CH_3NH_3X$ and $HC(NH_2)_2X$, and wherein X is selected from at least one of F, Cl, Br or I.

C29. A process according to clause 28, wherein perovskite precursor comprises a mixture of $CH_3NH_3Cl$ and $CH_3NH_3I$ C30. A process according to any preceding clause, wherein the perovskite layer comprises an organo-metal halide perovskite.

C31. A process according to clause 30, wherein the perovskite layer comprises at least one of $CH_3NH_3MX_3$ or $HC(NH_2)_2MX_3$, in which, M is selected from Pb, Sn, Tl, Bi, or In; and X is selected from at least one of F, Cl, Br or I.

C32. A process according to any preceding clause, wherein the perovskite layer comprises an organo-lead halide perovskite, preferably comprising at least one of $CH_3NH_3PbX_3$ or $HC(NH_2)_2PbX_3$, in which X is selected from at least one of F, Cl, Br or I.

C33. A process according to any preceding clause, wherein the perovskite layer comprises $CH_3NH_3MCl_xI_{3-x}$ or $CH_3NH_3MI_{3-x}Cl_x$, in which M is selected from at least one of Pb, Sn, Ge, Si, Ti, Bi, or In, preferably M is Pb.

C34. A process according to any preceding clause, wherein the substrate comprises a conductive substrate.

C35. A process according to any preceding clause, wherein the substrate comprises at least one of a polymer, metal, ceramic or glass, preferably a polymer film.

C36. A process according to any preceding clause, wherein the substrate comprises at least one of: metal, preferably selected from at least one of Pb, Sn, Ge, Si, Ti, Bi, In, Ni, Fe, stainless steel; FTO/ITO glass; glass with a conductive layer; polymer or plastic; or carbons/nanocarbons based substrates.

C37. A process according to any preceding clause, wherein the substrate includes one or more layers or coatings selected from at least one of:

at least one coating of a transparent conductive oxide (TCO);

at least one electrode screening layer;

at least one hole blocking layer;

at least one electron blocking layer;

at least one hole transporting layer; or at least one electron transporting layer.

C38. A process according to any preceding clause, wherein the substrate includes the following coatings:

at least one coating of a transparent conductive oxide (TCO) and at least one hole transporting layer applied to the TCO; or at least one coating of a TCO and at least one electron transporting layer applied to the TCO.

C39. A thin film photoactive layer formed using a process according to any one of the preceding clauses.

C40. An optoelectronic device including a photoactive layer formed using a process according to any one of the preceding clauses.

C41. A multi-junction solar cell including a photoactive layer formed using a process according to any one of the preceding clauses.

C42. An optoelectronic device according to clause 40 or 41 comprising a photoactive device, preferably comprising at least one of a photovoltaic cell, a photoactive sensor or a light emitting device.

C43. An optoelectronic device including a photoactive region which comprises:

a n-type region comprising at least one n-type layer;
a p-type region comprising at least one p-type layer; and
a photoactive layer formed by a process according to any one of clauses 1 to 38 disposed between the n-type region and the p-type region.

C44. An optoelectronic device comprising:

a negative electrode comprising a current collector and a negative electrode material;
a positive counter electrode comprising a current collector and a positive electrode material; and
a charge transporting material between the positive electrode and negative electrode;
wherein one or both of the positive electrode material and negative electrode material comprises a composite electrode material comprising:
a conductive substrate;
an electrode-screening layer; and
a photoactive layer formed by a process according to any one of clauses 1 to 38.

C45. An optoelectronic device according to clause 44, wherein the electrode-screening layer comprises
at least one hole blocking layer; or
at least one electron blocking layer.

C46. A process of forming a thin film photoactive layer of an optoelectronic device can comprise the steps of:
applying at least one coating of a metal M selected from at least one of Pb, Sn, Ge, Si, Ti, Bi, or In to a substrate to form a coated substrate; and
converting the metal coating of the coated substrate to a perovskite layer.

C47. Use of a substrate having a surface comprising or coated with a metal M selected from at least one of Pb, Sn, Ge, Si, Ti, Bi, or In to form a thin film photoactive layer comprising:
converting the metal surface or metal coating of the substrate to a perovskite layer.

C48. A process of forming a thin film photoactive layer of an optoelectronic device can comprise the steps of:
applying at least one coating of a metal M selected from at least one of Pb, Sn, Ge, Si, Ti, Bi, or In to a substrate to form a coated substrate; and
converting the metal coating of the coated substrate to a perovskite layer,
wherein the at least one coating of a metal M is applied to the substrate by a deposition method comprising at least one of electrodeposition, electrophoretic deposition, electroplating, or electroless deposition.

C49. A process of forming a thin film photoactive layer of an optoelectronic device can comprise the steps of:
applying at least one coating of a metal M selected from at least one of Pb, Sn, Ge, Si, Ti, Bi, or In to a substrate to form a coated substrate; and
converting the metal coating of the coated substrate to a perovskite layer, wherein the at least one coating of a metal M is applied to the substrate by a physical coating method comprising at least one of an evaporative coating method, sputter, or cold spray.

C50. An intermediate for use in forming a thin film photoactive layer of an optoelectronic device comprising a substrate having a surface comprising or coated with a metal M selected from at least one of Pb, Sn, Ge, Si, Ti, Bi, or In, wherein the metal surface or metal coating of the substrate is convertible to a perovskite layer by applying at least one perovskite precursor thereto.

C51. An intermediate according to clause 50, wherein the substrate is coated with a metal M having a thickness of between 25 and 200 nm.

C52. An intermediate according to clause 51, wherein the variation in thickness of metal M on the substrate is no more than 10 nm, preferably no more than 7 nm.

C53. An intermediate according to any one of clauses 50 to 52, wherein the substrate comprises a conductive substrate coated with a metal M.

C54. An intermediate according to clause 53, wherein the substrate comprises at least one of a polymer, metal, ceramic or glass, preferably a polymer film.

C55. An intermediate according to clause 53 or 54, wherein the substrate comprises at least one of: metal, preferably selected from at least one of Pb, Sn, Ge, Si, Ti, Bi, In, Ni, Fe, stainless steel; FTO/ITO glass; glass with a conductive layer; polymer or plastic; or carbons/nanocarbons based substrates.

C56. An intermediate according to any one of clauses 50 to 55, wherein the surface roughness of the intermediate is lower than the surface roughness of the substrate and preferably this difference is at least 2 nm and more preferably at least 3 nm.

C57. An intermediate according to any one of clauses 50 to 55, wherein the substrate includes one or more layers or coatings selected from at least one of:
at least one coating of a transparent conductive oxide (TCO);
at least one electrode screening layer;
at least one hole blocking layer;
at least one electron blocking layer;
at least one hole transporting layer; or
at least one electron transporting layer.

C58. An intermediate according to any one of clauses 50 to 56, wherein the substrate includes the following coatings:
at least one coating of a transparent conductive oxide (TCO) and at least one hole transporting layer applied to the TCO; or
at least one coating of a TCO and at least one electron transporting layer applied to the TCO.

C59. An intermediate comprising a metal compound $MX_2$ coating on a substrate for use in forming a thin film photoactive layer of an optoelectronic device comprising a substrate having a surface formed from a metal M coating selected from at least one of Pb, Sn, Ge, Si, Ti, Bi, or In contacted with a vapour X selected from a halide vapour comprising at least one of F, Cl, Br or I, or acetic acid vapour,
wherein the metal compound MX2 coating on the coated substrate comprises crystallite having a size of less than 100 nm, preferably between 1 nm and 100 nm, more preferably between 10 nm and 90 nm, and wherein the metal compound $MX_2$ coating on the substrate is convertible to a perovskite layer by applying at least one perovskite precursor thereto.

C60. An organo-metal halide perovskite layer according to clause 59, wherein the minimum value in a surface profilometry measurement of the substrate is less than the minimum value in a surface profilometry measurement of metal compound $MX_2$ coating on a substrate by at least 3 nm, preferably at least 5 nm, more preferably at least 7 nm.

C61. An organo-metal halide perovskite layer produced from an intermediate comprising a substrate having a surface comprising or coated with a metal M selected from at least one of Pb, Sn, Ge, Si, Ti, Bi, or In, wherein the metal surface or metal coating of the substrate is converted to the perovskite layer by applying at least one perovskite precursor thereto.

C62. An organo-metal halide perovskite layer having a roughness substantially matching the roughness of the substrate to which the layer is applied.

C63. An organo-metal halide perovskite layer according to clause 62, wherein the RMS (root mean squared) roughness is less than 10 nm and preferably less than 5 nm and even more preferably less than 3 nm.

C64. A method of monitoring the quality of a thin film photoactive layer of an optoelectronic device, comprising the steps of:

applying at least one coating of a metal M selected from at least one of Pb, Sn, Ge, Si, Ti, Bi, or In to a substrate by a deposition method comprising at least one of electrodeposition, electrophoretic deposition, electroplating, or electroless deposition to form a coated substrate; and converting the metal coating of the coated substrate to a perovskite layer, wherein the deposition method includes a deposition quality control sensor.

C65. A method according to clause 64, wherein the deposition quality control sensor comprises at least one of applied electrical current or voltage, frequency of the applied electrical signal or measured impedance of the final deposited product.

The invention claimed is:

1. A process of forming a thin film photoactive layer of an optoelectronic device comprising:
   providing a substrate having a metallic surface comprising or coated with a metal M selected from at least one of Pb, Sn, Ge, Si, Ti, Bi, or In; and
   converting the metallic surface of the substrate to a perovskite layer comprising an organo-metal halide perovskite, wherein the converting comprises:
   applying onto the surface of the substrate at least one perovskite precursor comprising at least one compound having a formula AX, or at least one reaction constituent for forming at least one compound having the formula AX, to form the perovskite layer, wherein A comprises a nitrogen-containing organic cation and X is selected from at least one of F, Cl, Br or I.

2. A process according to claim 1, further comprising, prior to the converting step, providing the substrate with a metallic coating comprising the metal M to form the metallic surface.

3. A process according to claim 2, wherein the coating comprising metal M is provided by a process comprising at least one of:

a deposition method including at least one of electrodeposition, electrophoretic deposition, electroplating, or electroless deposition;

a physical coating method including at least one of sputter, cold spray; or application of solid film or layer to the substrate; or an evaporative coating method.

4. A process according to claim 2, wherein the metal coating comprising the metal M has a thickness between 25 and 200 nm.

5. A process according to claim 3, wherein the coating comprising metal M is deposited on the substrate with a metal deposition rate of between 0.1 and 2 Angstrom/second.

6. A process according to claim 1, wherein the converting step comprises:
   contacting the metallic surface with a vapor X selected from a halide vapor comprising at least one of F, Cl, Br or I, or an acetic acid vapor, to form a coating comprising metal compound $MX_2$ on the substrate; and thereafter
   applying at least one perovskite precursor to the substrate to form the perovskite layer.

7. A process according to claim 6, wherein the metallic surface is contacted with a vapor X at between 50 and 200° C.

8. A process according to claim 1, wherein the perovskite precursor comprises at least one perovskite precursor vapor and the converting step includes forming the perovskite layer by vapor deposition.

9. A process according to claim 8, wherein the perovskite vapor deposition process comprises:
   exposing the substrate to a perovskite precursor vapor comprising the perovskite precursor or one or more reactants for producing said perovskite precursor; and
   allowing deposition of the perovskite precursor vapor onto the metal compound $MX_2$ coating on the substrate, to produce the perovskite layer thereon.

10. A process according to claim 9, wherein the perovskite vapor deposition is allowed to continue until a solid layer of perovskite is formed with a thickness of from 100 nm to 100 μm.

11. A process according to claim 1, wherein the perovskite precursor is a perovskite precursor solution comprising at least one perovskite precursor dissolved in a coating solvent.

12. A process according to claim 1, wherein A in the perovskite precursor AX comprises an organic cation having a formula $R_1R_2R_3R_4N$, wherein:
   $R_1$ is hydrogen, unsubstituted or substituted C1-C20 alkyl, or unsubstituted or substituted aryl;
   $R_2$ is hydrogen, unsubstituted or substituted C1-C20 alkyl, or unsubstituted or substituted aryl;
   $R_3$ is hydrogen, unsubstituted or substituted C1-C20 alkyl, or unsubstituted or substituted aryl; and
   $R_4$ is hydrogen, unsubstituted or substituted C1-C20 alkyl, or unsubstituted or substituted aryl.

13. A process according to claim 1, wherein A in the perovskite precursor AX comprises an organic cation having a formula $R_5R_6N=CH-NR_7R_8$, and wherein:
   $R_5$ is hydrogen, unsubstituted or substituted C1-C20 alkyl, or unsubstituted or substituted aryl;
   $R_6$ is hydrogen, unsubstituted or substituted C1-C20 alkyl, or unsubstituted or substituted aryl;
   $R_7$ is hydrogen, unsubstituted or substituted C1-C20 alkyl, or unsubstituted or substituted aryl; and
   $R_8$ is hydrogen, unsubstituted or substituted C1-C20 alkyl, or unsubstituted or substituted aryl.

14. A process according to claim 1, wherein the perovskite layer comprises at least one of $CH_3NH_3MX_3$ or $HC(NH_2)_2MX_3$, in which, M is selected from Pb, Sn, Tl, Bi, or In; and X is selected from at least one of F, Cl, Br or I.

15. A process according to claim 1, wherein the perovskite layer comprises at least one of $CH_3NH_3PbX_3$ or $HC(NH_2)_2PbX_3$, in which X is selected from at least one of F, Cl, Br or I.

16. A process according to claim 1, wherein the perovskite layer comprises $CH_3NH_3MCl_xI_{3-x}$, in which M is selected from at least one of Pb, Sn, Ge, Si, Ti, Bi, or In, preferably M is Pb.

17. A process according to claim 1, wherein the nitrogen containing organic cation comprises an ammonium group.

* * * * *